United States Patent
Lore et al.

(10) Patent No.: US 7,483,684 B2
(45) Date of Patent: Jan. 27, 2009

(54) MIXER

(75) Inventors: Pascal Lore, Tenri (JP); Yoshihisa Fujimoto, Nara (JP); Masayuki Miyamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 563 days.

(21) Appl. No.: 11/338,673

(22) Filed: Jan. 25, 2006

(65) Prior Publication Data

US 2006/0166637 A1 Jul. 27, 2006

Related U.S. Application Data

(60) Provisional application No. 60/646,600, filed on Jan. 26, 2005.

(51) Int. Cl.
*H04B 1/18* (2006.01)

(52) U.S. Cl. ................ 455/293; 455/324; 455/337

(58) Field of Classification Search .......... 455/313, 455/323, 324, 334, 337, 293; 327/113; 375/316
See application file for complete search history.

(56) References Cited

U.S. PATENT DOCUMENTS

2005/0025268 A1* 2/2005 Muhammad et al. ........ 375/346
2006/0135107 A1* 6/2006 Staszewski et al. ......... 455/307

OTHER PUBLICATIONS

Karvonen et al., "A 50-MHZ CMOS Quadrature Charge Sampling Circuit with 66 DB SFDR" IEEE International Symposium Circuit And Systems 2004, pp. 217-219. (May 2004).
Muhammad et al., "A Discrete-time Bluetooth Receiver in a 0.13 μm Digital CMOS Process" IEEE International solid-State Circuits Conference, vol. 47, Published, Feb. 2004, paper 15.1.

* cited by examiner

*Primary Examiner*—Nguyen Vo
(74) *Attorney, Agent, or Firm*—Birch, Stewart, Kolasch & Birch, LLP

(57) ABSTRACT

To realize a mixer with a charge subsampling circuit with which a base band signal can be readily obtained without being affected by noise from wide bandwidth signals or undesired signals. A current generating circuit 8 outputs a current in proportion to the input signal voltage. In response to a control signal from the timing generating block 6, a charge subsampling circuit 7 samples the current at the same sampling frequency as the carrier frequency. In a charge-integrating process accompanying the sampling, weighting is carried out on terms in the transfer function of the FIR filter using a set of selected weights.

12 Claims, 26 Drawing Sheets

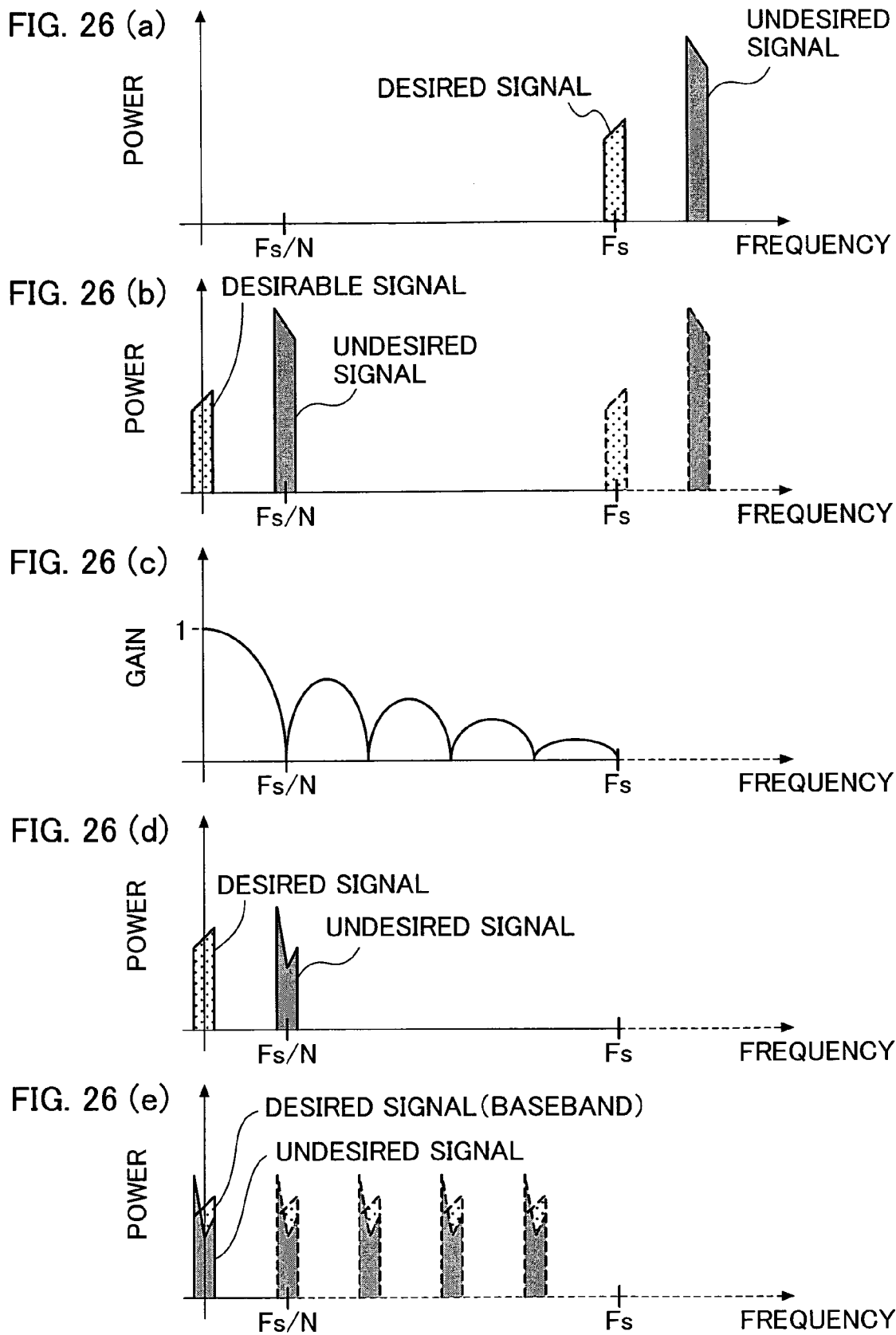

MIXER

This application claims the priority and benefit of U.S. Provisional Application Ser. No. 60/646,600 filed on Jan. 26, 2005, the entire contents of which are hereby incorporated by reference.

FIELD OF THE INVENTION

The present invention relates to charge subsampling mixers, especially those with filtering properties which attenuate aliasing undesired signals.

BACKGROUND OF THE INVENTION

Bandpass FIR filter properties can be obtained with conventional charge sampling circuits by controlling the integration/non-integration of a current proportional to an input signal. See, for example, "A 50-MHz CMOS Quadrature Charge Sampling Circuit With 66-dB SFDR," S. Karvonen et al., IEEE International Symposium Circuits and Systems 2004, May 2004, Paper 11.5 (hereinafter, "non-patent document 1"). In a charge sampling circuit introduced in non-patent document 1, an input voltage is converted to current which is then stored in the form of electric charge by an integrator containing a capacitor and an amplifier. The storage period is controlled by a switch. Filtering becomes possible by alternatively turning on/off the switch according to a specified pattern. If a signal is sampled below the Nyquist frequency, aliased noise occurs in base band, degrading an SN ratio. In non-patent document 1, however, an input signal is sampled at a frequency beyond the Nyquist frequency and subjected to bandpass filtering before downsampling (decimation) to generate a low frequency output. In this instance, the frequency of a signal controlling the input switch is set to four times the frequency of the input signal. The output signal has a low frequency.

Non-patent document 1 introduces a scheme whereby a signal is subjected to Nyquist sampling after it is downconverted from a RF (carrier frequency) to a low frequency (IF). Before that circuit, a Gilbert mixer is needed for the RF-to-IF downconversion as in conventional art.

The scheme of non-patent document 1 attenuates the aliasing undesired signals caused by the downsampling by 18 dB. If one wants to apply the scheme to a tuner, a bandpass filter (BPF) with a sharp cutoff frequency profile needs be coupled to the input to filter out the undesired signals.

However, the charge sampling circuit of non-patent document 1 has a sampling frequency four times the carrier frequency. The circuit is difficult to make compliant with the latest communications standards which involve high carrier frequencies. There already exists a subsampling circuit which addresses these problems. The circuit implements subsampling below twice the carrier frequency. However, the sampling frequency should be higher than twice the maximum frequency of a base band signal based on which the carrier is modulated.

An example of the conventional charge subsampling mixer is shown in FIG. 21. See, for example, "A Discrete-Time Bluetooth Receiver in a 0.13 μm Digital CMOS Process," K. Muhammad et al., 2004 IEEE International Solid-State Circuits Conference, February 2004, Paper 15.1 (hereinafter, "non-patent document 2"). A charge subsampling mixer 100 in FIG. 21 includes a transconductance stage 101, an input switch 102, two paths path_a and path_b, and an output capacitor 111. The transconductance stage (hereinafter, "gm stage") 101 is a current source generating a current in proportion to the voltage value of a radio frequency ("RF") input signal supplied at the input terminal IN. The paths path_a and path_b process signals.

The path path_a includes a switch 103, an integrating capacitor 107, a reset switch 105, and an output switch 109. The switch 103 opens/closes the path. The reset switch 105 discharges the integrating capacitor 107. The output switch 109 allows/disallows a voltage in proportion to the charge stored in the integrating capacitor 107 to be applied to an output terminal OUT.

The path path_b includes a switch 104, an integrating capacitor 108, a reset switch 106, and an output switch 109. The switch 104 opens/closes the path. The reset switch 106 discharges the integrating capacitor 108. The output switch 109 allows/disallows a voltage in proportion to the charge stored in the integrating capacitor 108 to be applied to an output terminal OUT.

FIG. 22 shows signal waveforms, from a control circuit (not shown), controlling the switches in the charge subsampling mixer 100. When the signal level is 1 in the figure, the associated switch turns on; when the signal level is 0, the associated switch turns off. A signal LO, controlling the input switch 102, consists of pulses at 50% duty factor at the same frequency as the carrier frequency for the RF input signal. This frequency is designated a basic sampling frequency Fs for the system. An equivalent basic period to the frequency, termed Ts, is given by $$Ts = \frac{1}{Fs}$$

Both a signal enable_a, controlling the switch 103 opening/closing the path path_a, and a signal enable_b, controlling the switch 104 opening/closing the path path_b, are a rectangular wave at a frequency of Fs/N where N is an integer greater than 1. The signals enable_a and enable_b are 1 for certain periods. To set the phase difference between the signals enable_a and enable_b to 180 degrees, the signal enable_b is off when the signal enable_a is on. When the signal enable_a (enable_b) for the path path_a (path_b) changes to 0, a signal out_a (out_b), controlling the output switch 109, changes to 1 and remains so for a period of N/2×Ts (=0.5×N/Fs). The signal reset_a controlling the reset switch 105, when the signal out_a (out_b) for the path path_a changes to 0, changes to 1 and remains so for a period of N/2×Ts (=0.5×N/Fs). The signal out_b controlling the output switch 110, when the signal enable_b for the path path_b changes to 0, changes to 1 and remains so for a period of N/2×Ts (=0.5×N/Fs). The signal reset_b controlling the reset switch 106, when the signal out_b for the path path_b changes to 0, changes to 1 and remains so for a period of N/2×Ts (=0.5×N/Fs).

The operational principles of the charge subsampling mixer 100 will be now described in reference to FIG. 23. When the signal enable_a is 1, if the signal LO changes to 1, the gm stage 101 supplies current to the integrating capacitor 107, changing a charge Qi stored in the integrating capacitor 107. The charge accumulated by the integrating capacitor 107 from time k×Ts to time (k+½)×Ts is given by $$\Delta q_k = \int_{k \cdot T_s}^{(k+1/2) \cdot T_s} i(t)\,dt = \int_{-\infty}^{+\infty} i(t) \cdot \gamma(kT_s - t)\,dt$$

where i(t) is the output current from the gm stage 101, and γ(t) is the basic waveform of the signal LO in FIG. 24. The expression states the correlation between i(t) and γ(t), which is given by $$\Delta q_k = [i(x) \Gamma](kT_s)$$

Taking the Fourier transform of the expression, we obtain $$\Delta Q_k(f) = Ic(f) \cdot \Gamma(f) \cdot e^{-j2\pi f k T_s} = Ic(f) \cdot \Gamma(f) \cdot z^{-k}$$

where Ic(f) and Γ(f) are the Fourier transforms of i(t) and γ(t) respectively. In the expression, z is given by $$z = e^{j2\pi f T_s}$$

Γ(f) is given by $$\Gamma(f) = e^{j\frac{T_s}{4} 2\pi f} \frac{e^{j\frac{T_s}{4} 2\pi f} - e^{-j\frac{T_s}{4} 2\pi f}}{j2\pi \cdot f} = e^{j\frac{T_s}{2} \pi f} \frac{\sin\left(\pi \cdot f \frac{T_s}{2}\right)}{\pi \cdot f}$$

The sinus cardinal (hereinafter, "sin c") function is defined by $$\sin c(x) = \frac{\sin(x)}{x}$$

Using the sin c function, Γ(f) is given by $$\Gamma(f) = e^{j\frac{T_s}{2}\pi f} \frac{T_s}{2} \sin c\left(\pi \cdot f \frac{T_s}{2}\right)$$

From this expression, the Fourier transform of the charge accumulated from a time when LO changes to 1 to a time when it subsequently changes back to 0 is given by $$\Delta Q_k = e^{j\frac{T_s}{2}\pi f} \frac{T_s}{2} \sin c\left(\pi \cdot f \frac{T_s}{2}\right) \cdot Ic(f) \cdot z^{-k}$$

While the signal enable_a is 1, the integrating capacitor 107 is charged N times. As the signal out_a changes to 1, the integrating capacitor 107 discharges completely. Furthermore, while the signal enable_b is 1, the integrating capacitor 108 is charged N times. As the signal out_b changes to 1, the integrating capacitor 108 discharges completely. In the waveform example in FIG. 22 (or FIG. 23), N=5. After the integrating capacitors 107, 108 output voltage, the reset signals reset_a and reset_b are changed to 1 to discharge the integrating capacitors 107, 108. The reset enables the capacitors 107, 108 to integrate from 0 every time. The charge stored in the capacitors 107, 108 is given by $$q_{out} = \Delta q_0 + \Delta q_1 + \Delta q_2 + \Delta q_3 + \Delta q_4$$

This is shown in FIG. 23. Using this expression, the Fourier transform of the output charge is given by $$Q_{out}(f) = e^{j\frac{T_s}{2}\pi f} \frac{T_s}{2} \sin c\left(\pi \cdot f \frac{T_s}{2}\right) \cdot Ic(f) \cdot (1 + z^{-1} + z^{-2} + z^{-3} + z^{-4})$$

It is understood that the expression represents a property (transfer function) of an FIR (finite impulse response) filter:

FIR=$(1+z^{-1}+z^{-2}+z^{-3}+z^{-4})$. Hence, an FIR filter is realized by integrating the charge which forms the output current of the gm stage 1010, and unwanted signals are removed using that FIR filter.

In addition, letting Ci represent the capacitance of the integrating capacitor, the output voltage $V_{out}(f)$ is given by $$V_{out}(f) = \frac{Q_{out}(f)}{C_i}$$

The relationship between the current Ic and the input voltage $V_{in}(f)$ is given by $$Ic(f) = gm \cdot V_{in}(f)$$

where gm is the transconductance of the gm stage 101.

In addition, transferring the charge stored in the integrating capacitors 107, 108 to the output capacitor 111 causes charge sharing. Therefore, the output voltage $V_o(f)$ of the output capacitor 111 is given by $$V_o(f) = \frac{z^{-N}}{1 + \frac{C_o}{C_i}(1 - z^{-N})} V_{out}(f)$$

where Co is the capacitance of the output capacitor 111. This transfer function is a property of an IIR (infinite impulse response) filter.

From the expression, the frequency characteristic of the output voltage Vo (f) is given by $$V_o(f) = \frac{gm}{C_i} \frac{T_s}{2} \sin c\left(\pi \cdot f \frac{T_s}{2}\right) \cdot FIR \cdot IIR \cdot V_{in}(f)$$

The factor, $$e^{j\frac{T_s}{2}\pi f},$$

does not affect the gain and is therefore neglected in the expression. The factor however affects the phase.

The zero point frequency for the FIR filter is equal to the aliasing frequency, lowering aliasing noise. Effects will be described in reference to FIGS. 25(a) to 25(e). The horizontal axes of all the graphs in FIGS. 25(a) to 25(e) show frequency. The vertical axes of all the graphs, except FIG. 25(c), show signal power. The vertical axis in FIG. 25(c) shows a FIR gain standardized with a maximum FIR gain. FIG. 25(a) is a signal spectrum at the input terminal of the gm stage 101. The signal spectrum demonstrates a desired signal, or a carrier frequency Fs, and noise. Integrating charge by the capacitors 107, 108 and sampling at a sampling frequency Fs generates a discrete time signal in the bandwidth 1/N times the sampling frequency Fs, as shown in FIG. 25(b). The desired signal aliases to DC, all noise is aliased to the bandwidth from 0 to Fs. FIG. 25(c) shows an FIR filter property realized by charge integration and resetting of the capacitors 107, 108. FIG. 25(d) is the signal spectrum in FIG. 25(b) after it is filtered by the FIR filter. Noise is filtered out at Fs/N, 2Fs/N, and other frequencies. FIG. 25(e) shows the signal spectrum in FIG. 25(d) after it is downsampled (the signal spectrum at the output terminal OUT of the charge sampling mixer 100). Noise is aliased to the bandwidth from 0 to Fs/N, but not in the signal bandwidth. The signal in FIG. 25(e) can be demodulated to obtain a base band signal.

The foregoing description is applicable in the absence of undesired signals and when the desired signal has a narrow bandwidth. If the desired signal has a wide bandwidth, like television broadcast waves (both analog and digital), noise is less attenuated on the edges of the bandwidth, with noise being aliased to the bandwidth of the desired signal. Furthermore, undesired signals are aliased, appearing at higher frequencies than the desired signal. Effects of these phenomena will be described in reference to FIGS. 26(a) to 26(e).

FIGS. 26(a) to 26(e) correspond to FIGS. 25(a) to 25(e). FIG. 26(a) assumes the presence of an undesired signal in addition to the desired signal. FIG. 26(b) shows the undesired signal being aliased the same way as the noise in FIGS. 25(a) to 25(e). FIG. 26(d) shows the aliased undesired signal being attenuated by the FIR filter. However, if the desired signal has a wide bandwidth, the undesired signal is insufficiently attenuated on the edges of the bandwidth of the aliased signal. The aliased undesired signal still has high power as shown in FIG. 26(e), making it difficult to retrieve the desired base band signal. To further reduce undesired signal aliasing, a filter with a sharp cutoff frequency profile is needed at the input of the subsampling mixer.

Raising the order of the FIR may possibly attenuate the undesired signal. However, to raise the order of the FIR, the downsampling factor N needs be increased, which in turn will narrow down the output bandwidth Fs/N. The bandwidth needs be twice that of the desired signal, placing limits on the increase of N. Should N be sufficiently large, the order of the IIR increases due to charge sharing, resulting in different gains in the bandwidth.

SUMMARY OF THE INVENTION

The present invention, conceived to address these conventional problems, has an objective to provide a mixer with a charge subsampling circuit with which a base band signal can be readily obtained without being affected by noise from wide bandwidth signals or undesired signals.

The mixer of the present invention, to solve the problems, is characterized in that: it is a mixer for producing a base band signal by demodulating an input signal which is a carrier modulated with the base band signal, the mixer comprising: a current source for generating a current in proportion to a voltage of the input signal; a charge subsampling circuit to which the current generated by the current source is supplied; and a control circuit for generating a signal controlling sampling of the current by the charge subsampling circuit, wherein the charge subsampling circuit, under control of the sampling by the control circuit, generates a discrete time signal in a bandwidth 1/N times a frequency of the carrier from the input signal (N is an integer greater than 1), and the mixer performing filtering by means of an FIR filter realized by a charge integrating process of forming current which accompanies the generation of the discrete time signal, wherein the charge subsampling circuit carries out: the sampling at the same sampling frequency as the frequency of the carrier; and in the integrating process, weighting of terms in a transfer function of the FIR filter with weights selected from a set of weights.

According to the invention, the weighting of terms in a transfer function renders the gain characteristic of the FIR filter capable of greatly attenuating the entire aliased undesired signal.

Consequently, a mixer is realized which includes a charge subsampling circuit with which a base band signal can be readily obtained without being affected by noise from wide bandwidth signals or undesired signals.

In addition, the FIR filter is capable of greatly attenuating the entire aliased undesired signal. This reduces the attenuation required of the bandpass filter which is located upstream to the charge subsampling mixer, allowing lower power consumption and circuit area.

The mixer of the present invention, to solve the problems, is characterized in that: the current source has as many current outputs as charge subsampling circuits for each input signal; and the outputs are coupled to inputs of different charge subsampling circuits.

According to the invention, no matter how many charge subsampling circuits are involved. the current source is able to supply the individual charge subsampling circuits with suitable current in accordance with the input signal.

The mixer of the present invention, to solve the problems, is characterized in that the current source generates the current by means of a transconductance stage provided for each of the outputs.

According to the invention, each transconductance stage only needs to supply current to one charge subsampling circuit. There is no need for large output power.

The mixer of the present invention, to solve the problems, is characterized in that the current source generates the current by means of one transconductance stage provided commonly for the outputs.

According to the invention, only one transconductance stage is used. This reduces circuit size and improves on path matching.

The mixer of the present invention, to solve the problems, is characterized in that: the charge subsampling circuit has a positive-side path and a negative-side path, forming a differential output, which are coupled to an output of the current source; the positive-side path has an A first switch, an A second switch, an A fourth switch, an A third switch, and a first capacitor, the A first switch, the A second switch, and the A fourth switch being connected sequentially in series from an input side to an output side, the A third switch and the first capacitor being connected between respective points between the A second switch and the A fourth switch and a place of a first reference voltage; and the negative-side path has an A fifth switch, an A sixth switch, an A eighth switch, an A seventh switch, and a second capacitor, the A fifth switch, the A sixth switch, and the A eighth switch being connected sequentially in series from an input side to an output side, the A seventh switch and the second capacitor being connected between respective points between the A sixth switch and the A eighth switch and a place of a second reference voltage; wherein: letting Fs represent the sampling frequency which is equal to the frequency of the carrier and the mixer comprise m charge subsampling circuits, the A first switch is turned on/off under control of a first rectangular signal having a frequency of Fs; the A fifth switch is turned on/off under control of a second rectangular signal 180 degrees out of phase with the first rectangular signal; the A second switch and the A sixth switch are turned on/off under control of an A first digital signal having a period of N×m/Fs; the A fourth switch and the A eighth switch are turned on/off under control of an A second digital signal having a period of N×m/Fs; the A third switch and the A seventh switch are turned on/off under control of an A third digital signal having a period of N×m/Fs; there are provided time periods T1, T2, and T3 in this sequence in one period of the A first to A third digital signals, the time periods T1, T2, and T3 when summed being equal to the period; in the time period T1, the A first digital signal is a series of 1s and 0s, whereas the A second digital signal and the A third digital signal are 0; in the time period T2, the A second digital signal is 1, whereas the A first digital signal and the A third digital signal are 0; and in the time period T3, the A third digital signal is 1, whereas the A first digital signal and the A fourth digital signal are 0.

According to the invention, a charge subsampling mixer is readily realized with FIR filter properties capable of greatly attenuating the entire aliased undesired signal.

The mixer of the present invention, to solve the problems, is characterized in that: the charge subsampling circuit has a positive-side path and a negative-side path, the positive-side path forming a differential output and including a B first switch and being coupled to an output of the current source via the B first switch, the negative-side path including a B second switch and being coupled to an output of the current source via the B second switch; the positive-side path includes a first positive-side path and a second positive-side path provided in parallel between the B first switch and a plus output terminal of the differential output; the negative-side path includes a first negative-side path and a second negative-side path provided in parallel between the B second switch and a minus output terminal of the differential output; the first positive-side path has a B third switch, a B fifth switch, a B fourth switch, and a first capacitor, the B third switch and the B fifth switch being connected sequentially in series from an input side to an output side, the B fourth switch and the first capacitor being connected between respective points between the B third switch and the B fifth switch and a place of a first reference voltage; the second positive-side path has a B sixth switch, a B eighth switch, a B seventh switch, and a second capacitor, the B sixth switch and the B eighth switch being connected sequentially in series from an input side to an output side, the B seventh switch and the second capacitor being connected between respective points between the B sixth switch and the B eighth switch and a place of a second reference voltage; the first negative-side path has a B ninth switch, a B eleventh switch, a B tenth switch, and a third capacitor, the B ninth switch and the B eleventh switch being connected sequentially in series from an input side to an output side, the B tenth switch and the third capacitor being connected between respective points between the B ninth switch and the B eleventh switch and a place of a third reference voltage; and the second negative-side path has a B twelfth switch, a B fourteenth switch, a B thirteenth switch, and a fourth capacitor, the B twelfth switch and the B fourteenth switch being connected sequentially in series from an input side to an output side, the B thirteenth switch and the fourth capacitor being connected between respective points between the B twelfth switch and the B fourteenth switch and a place of a fourth reference voltage, wherein: letting Fs represent the sampling frequency which is equal to the frequency of the carrier and the mixer comprise m charge subsampling circuits, the B first switch is turned on/off under control of a first rectangular signal having a frequency of Fs;

the B second switch is turned on/off under control of a second rectangular signal 180 degrees out of phase with the first rectangular signal;

the B third switch and the B ninth switch are turned on/off under control of a B first digital signal having a period of N×m/Fs;

the B sixth switch and the B twelfth switch are turned on/off under control of a B second digital signal having a period of N×m/Fs;

the B fifth switch, the B eighth switch, the B eleventh switch, and the B fourteenth switch are turned on/off under control of a B third digital signal having a period of N×m/Fs;

the B fourth switch, the B seventh switch, the B tenth switch, and the B thirteenth switch are turned on/off under control of a B fourth digital signal having a period of N×m/Fs;

there are provided time periods T1, T2, and T3 in this sequence in one period of the B first to B fourth digital signals, the time periods T1, T2, and T3 when summed being equal to the period;

in the time period T1, the B first digital signal and the B second digital signal are a series of 1s and 0s and are not simultaneously 1, whereas the B third digital signal and the B fourth digital signal are 0;

in the time period T2, the B third digital signal is 1, whereas the B first digital signal, the B second digital signal, and the B fourth digital signal are 0; and in the time period T3, the B fourth digital signal is 1, whereas the B first digital signal, the B second digital signal, and the B third digital signal are 0.

According to the invention, a charge subsampling mixer is readily realized with FIR filter properties capable of greatly attenuating the entire aliased undesired signal.

In addition, the mixer includes more capacitors to perform an integrating process, like the B first to B fourth capacitors. This in turn allows for increases in the magnitudes of the weights realized by the FIR filter, that is, the coefficients of the terms in the transfer function.

The mixer of the present invention, to solve the problems, is characterized in that: the charge subsampling circuit has a C first switch, a C second switch, a first positive-side path, a second negative-side path, a first negative-side path, and a second positive-side path, the first positive-side path and the second negative-side path being coupled to an output of the current source via the C first switch, the first negative-side path and the second positive-side path being coupled to an output of the current source via the C second switch; the first positive-side path includes a C third switch, a C fifth switch, a C fourth switch, and a first capacitor, the C third switch and the C fifth switch being connected sequentially in series from an input side to an output side between the C first switch and a plus output terminal of a differential output, the C fourth switch and the first capacitor being connected between respective points between the C third switch and the C fifth switch and a place of a first reference voltage; the first negative-side path includes a C sixth switch, a C eighth switch, a C seventh switch, and a second capacitor, the C sixth switch and the C eighth switch being connected sequentially in series from an input side to an output side between the C second switch and a minus output terminal of the differential output, the C seventh switch and the second capacitor being connected between respective points between the C sixth switch and the C eighth switch and a place of a second reference voltage; the second positive-side path includes a C tenth switch, the C fifth switch, the C fourth switch, and the first capacitor, the C tenth switch and the C fifth switch being connected sequentially in series from an input side to an output side between the C second switch and the plus output terminal; and the second negative-side path includes a C ninth switch, the C eighth switch, the C seventh switch, and the second capacitor, the C ninth switch and the C eighth switch being connected sequentially in series from an input side to an output side between the C first switch and the minus output terminal; wherein letting Fs represent the sampling frequency which is equal to the frequency of the carrier and the mixer comprise m charge subsampling circuits, the C first switch is turned on/off under control of a first rectangular signal having a frequency of Fs; the C second switch is turned on/off under control of a second rectangular signal 180 degrees out of phase with the first rectangular signal; the C third switch and the C sixth switch are turned on/off under control of a C first digital signal having a period of N×m/Fs; the C ninth switch and the C tenth switch are turned on/off under control of a C second digital signal having a period of N×m/Fs; the C fifth switch and the C eighth switch are turned on/off under control of a C third digital signal having a period of N×m/Fs; the C fourth switch and the C seventh switch are turned on/off under control of a C fourth digital signal having a period of N×m/Fs; there are provided time periods T1, T2, and T3 in this sequence in one period of the C first to C fourth digital signals, the time periods T1, T2, and T3 when summed being equal to the period; in the time period T1, the C first digital signal and the C second digital signal are a series of 1s and 0s and are not simultaneously 1, whereas the C third digital signal and the C fourth digital signal are 0; in the time period T2, the C third digital signal is 1, whereas the C first digital signal, the C second digital signal, and the C fourth digital signal are 0; and in the time period T3, the C fourth digital signal is 1, whereas the C first digital signal, the C second digital signal, and the C third digital signal are 0.

According to the invention, a charge subsampling mixer is readily realized with FIR filter properties capable of greatly attenuating the entire aliased undesired signal.

In addition, each FIR filter weight has three values. With more types of coefficients for the terms in the transfer function of the FIR filter, suitable FIR filters for specific applications are readily realized.

The mixer of the present invention, to solve the problems, is characterized in that: the charge subsampling circuit has a positive-side path and a negative-side path, forming a differential output, which are coupled to an output of the current source; the positive-side path has a D first switch, a D second switch, a D fourth switch, a D third switch, and a first capacitor, the D first switch, the D second switch, and the D fourth switch being connected sequentially in series from an input side to an output side, the D third switch and the first capacitor being connected between respective points between the D second switch and the D fourth switch and a place of a first reference voltage; and the negative-side path has a D fifth switch, a D sixth switch, a D eighth switch, a D seventh switch, and a second capacitor, the D fifth switch, the D sixth switch, and the D eighth switch being connected sequentially in series from an input side to an output side, the D seventh switch and the second capacitor being connected between respective points between the D sixth switch and the D eighth switch and a place of a second reference voltage, wherein: letting Fs represent the sampling frequency which is equal to the frequency of the carrier and the mixer comprise m charge subsampling circuits, the D first switch is turned on/off under control of a first rectangular signal having a frequency of Fs; the D fifth switch is turned on/off under control of a second rectangular signal 180 degrees out of phase with the first rectangular signal; the D second switch is turned on/off under control of a D first digital signal having a period of N×m/Fs; the D sixth switch is turned on/off under control of a D second digital signal having a period of N×m/Fs; the D fourth switch and the D eighth switch are turned on/off under control of a D third digital signal having a period of N×m/Fs; the D third switch and the D seventh switch are turned on/off under control of a D fourth digital signal having a period of N×m/Fs; there are provided time periods T1, T2, and T3 in this sequence in one period of the D first to D fourth digital signals, the time periods T1, T2, and T3 when summed being equal to the period; in the time period T1, the D first digital signal and the D second digital signal are a series of 1s and 0s, whereas the D third digital signal and the D fourth digital signal are 0; in the time period T2, the D third digital signal is 1, whereas the D first digital signal, the D second digital signal, and the D fourth digital signal are 0; and in the time period T3, the D fourth digital signal is 1, whereas the D first digital signal, the D second digital signal, and the D third digital signal are 0.

According to the invention, a charge subsampling mixer is readily realized with FIR filter properties capable of greatly attenuating the entire aliased undesired signal.

In addition, the D first digital signal and the D second digital signal have an extended minimum period. The ratio of the minimum period for the signal to the rising period for the signal is increased. So is the ratio of the minimum period for the signal to the falling period for the signal. This diminishes errors in charging of the D first capacitor and the D second capacitor, that is, the integrating process, which in turn makes it easier to realize the charge subsampling circuit.

The mixer of the present invention, to solve the problems, is characterized in that: the charge subsampling circuit has a positive-side path and a negative-side path, forming a differential output, which are coupled to an output of the current source; the positive-side path has an E first switch, an E third switch, an E second switch, and a first capacitor, the E first switch and the E third switch being connected sequentially in series from an input side to an output side, the E second switch and the first capacitor being connected between respective points between the E first switch and the E third switch and a place of a first reference voltage; and the negative-side path has an E fourth switch, an E sixth switch, an E fifth switch, and a second capacitor, the E fourth switch and the E sixth switch being connected sequentially in series from an input side to an output side, the E fifth switch and the second capacitor being connected between respective points between the E fourth switch and the E sixth switch and a place of a second reference voltage, wherein: letting Fs represent the sampling frequency which is equal to the frequency of the carrier and the mixer comprise m charge subsampling circuits, the E first switch is turned on/off under control of an E first digital signal having a period of N×m/Fs; the E fourth switch is turned on/off under control of an E second digital signal having a period of N×m/Fs; the E third switch and the E sixth switch are turned on/off under control of an E third digital signal having a period of N×m/Fs; the E second switch and the E fifth switch are turned on/off under control of an E fourth digital signal having a period of N×m/Fs; there are provided time periods T1, T2, and T3 in this sequence in one period of the E first to E fourth digital signals, the time periods T1, T2, and T3 when summed being equal to the period; in the time period T1, the E first digital signal and the E second digital signal are a series of 1s and 0s and are not simultaneously 1, whereas the E third digital signal and the E fourth digital signal are 0; in the time period T2, the E third digital signal is 1, whereas the E first digital signal, the E second digital signal, and the E fourth digital signal are 0; and in the time period T3, the E fourth digital signal is 1, whereas the E first digital signal, the E second digital signal, and the E third digital signal are 0.

According to the invention, a charge subsampling mixer is readily realized with FIR filter properties capable of greatly attenuating the entire aliased undesired signal.

In addition, the E first switch and the E fourth switch are the only switches that connect the charge subsampling circuits to the output of the current source. The switches, hence their parasitic capacitance and resistance, are reduced, The circuit area is also reduced.

The mixer of the present invention, to solve the problems, is characterized in that T1=N×(m−1)/Fs, T2=0.5×N/Fs, and T3=0.5×N/Fs.

According to the invention, these timings make it easier to realize a control circuit. In addition, the timings provide a sufficiently extended period for the transfer of stored charge to output and for the erasure of the stored charge. This in turn allows for smaller output and reset switches.

The mixer of the present invention, to solve the problems, is characterized in that the first capacitor and the second capacitor have equal capacitances. With the first capacitor and the second capacitor having equal capacitances, the paths with the charge subsampling circuits have the same characteristics. Mismatching between the paths is reduced when the mixer is built.

The mixer of the present invention, to solve the problems, is characterized in that: the first capacitor and the third capacitor have equal capacitances; the second capacitor and the fourth capacitor have equal capacitances; and the capacitances of the first capacitor and the third capacitor are different from those of the second capacitor and the fourth capacitor.

According to the invention, each FIR filter weight has three values. With more types of coefficients for the terms in the transfer function of the FIR filter, suitable FIR filter for specific applications are readily realized.

In the mixer of the present invention, as described in the foregoing, the charge subsampling circuit carries out: the sampling at the same sampling frequency as the frequency of the carrier; and in the integrating process, weighting of terms in a transfer function of the FIR filter with weights selected from a set of weights.

Consequently, a mixer is realized which includes a charge subsampling circuit with which a base band signal can be readily obtained without being affected by noise from wide bandwidth signals or undesired signals.

BRIEF DESCRIPTION OF THE DRAWINGS

FIG. 26(a) through FIG. 26(e) are spectrum drawings and a gain characteristic drawing for an FIR filter, illustrating the mixer in FIG. 21 failing to sufficiently attenuate an undesired signal.

DESCRIPTION OF THE EMBODIMENTS

The following will describe embodiments of the present invention in reference to figures. Symbols used there include:

Fs, the basic sampling frequency for the charge subsampling circuit, set to be equal to the carrier frequency for the RF input signal.

Ts, the basic sampling period for the charge subsampling circuit. Ts=1/Fs.

N, a downsampling factor. An integer greater than 1. The output signal frequency is Fs/N after downsampling.

M, the FIR filter order realized by integrating capacitors and a control pattern of switches.

m, the number of charge subsampling circuits connected in parallel.

gm: the transconductance of the gm stage.

$C_i$, the capacitance of the integrating capacitors.

$C_o$: the capacitance of the output capacitors.

Embodiment 1

An embodiment of the present invention will be now described in reference to FIG. 1(a) through FIG. 9.

FIG. 2(a) is a block diagram illustrating the arrangement of a charge subsampling mixer (mixer) 1 in accordance with the present embodiment. The charge subsampling mixer 1 includes a timing generating block (control circuit) 11, three charge subsampling circuits 12 to 14, and a current generating circuit (current source) 15. Although not shown in FIG. 2(a), an output capacitor is coupled to the output terminal OUT.

Figure 3:
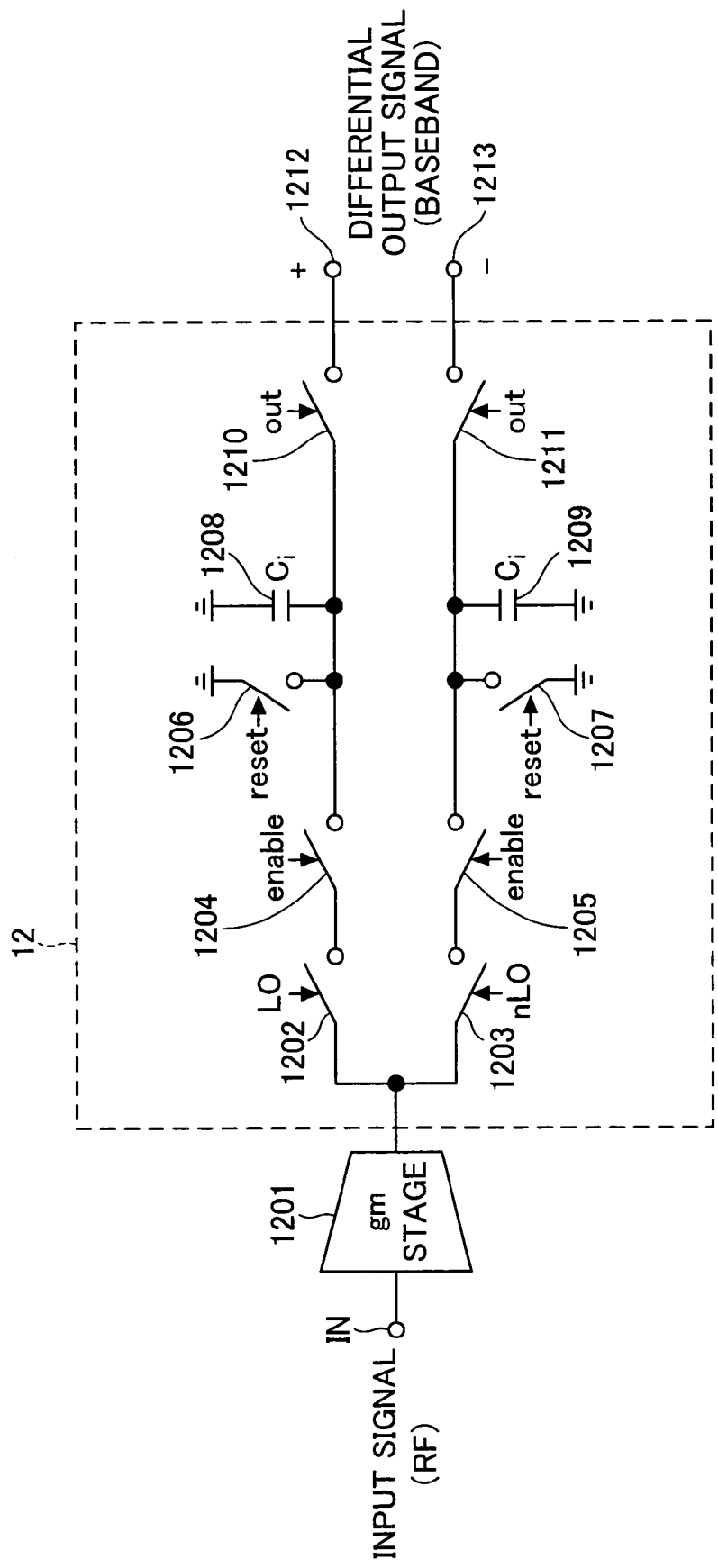
FIG. 3 is a circuit diagram illustrating the arrangement of a charge subsampling circuit in the mixers shown in FIG. 1(a) and FIG. 2(a).
Figure 5:
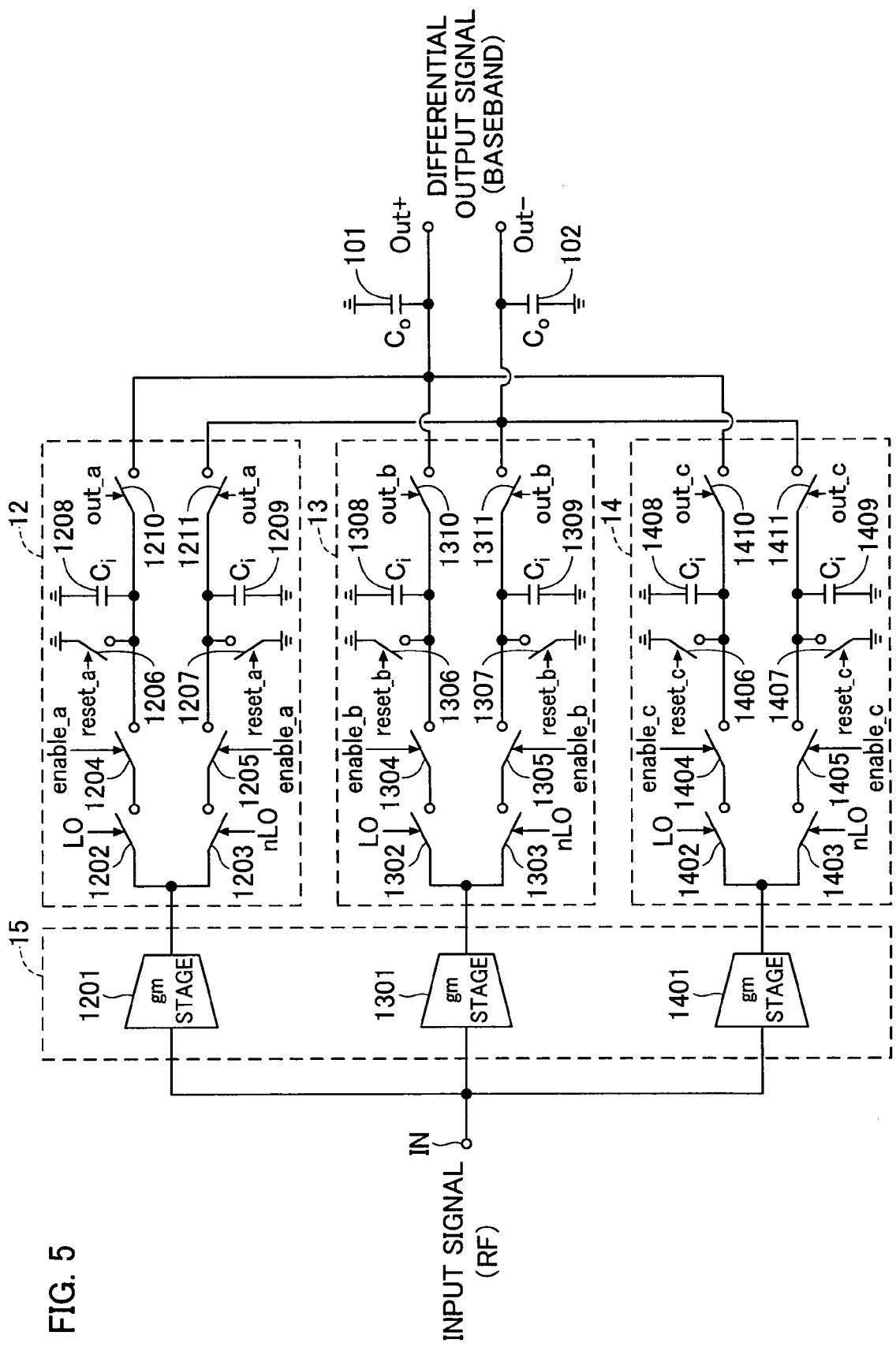
FIG. 5 is a circuit block diagram illustrating the mixer in FIG. 2(a) by way of a detailed structural drawing of a charge subsampling circuit.
Figure 6:
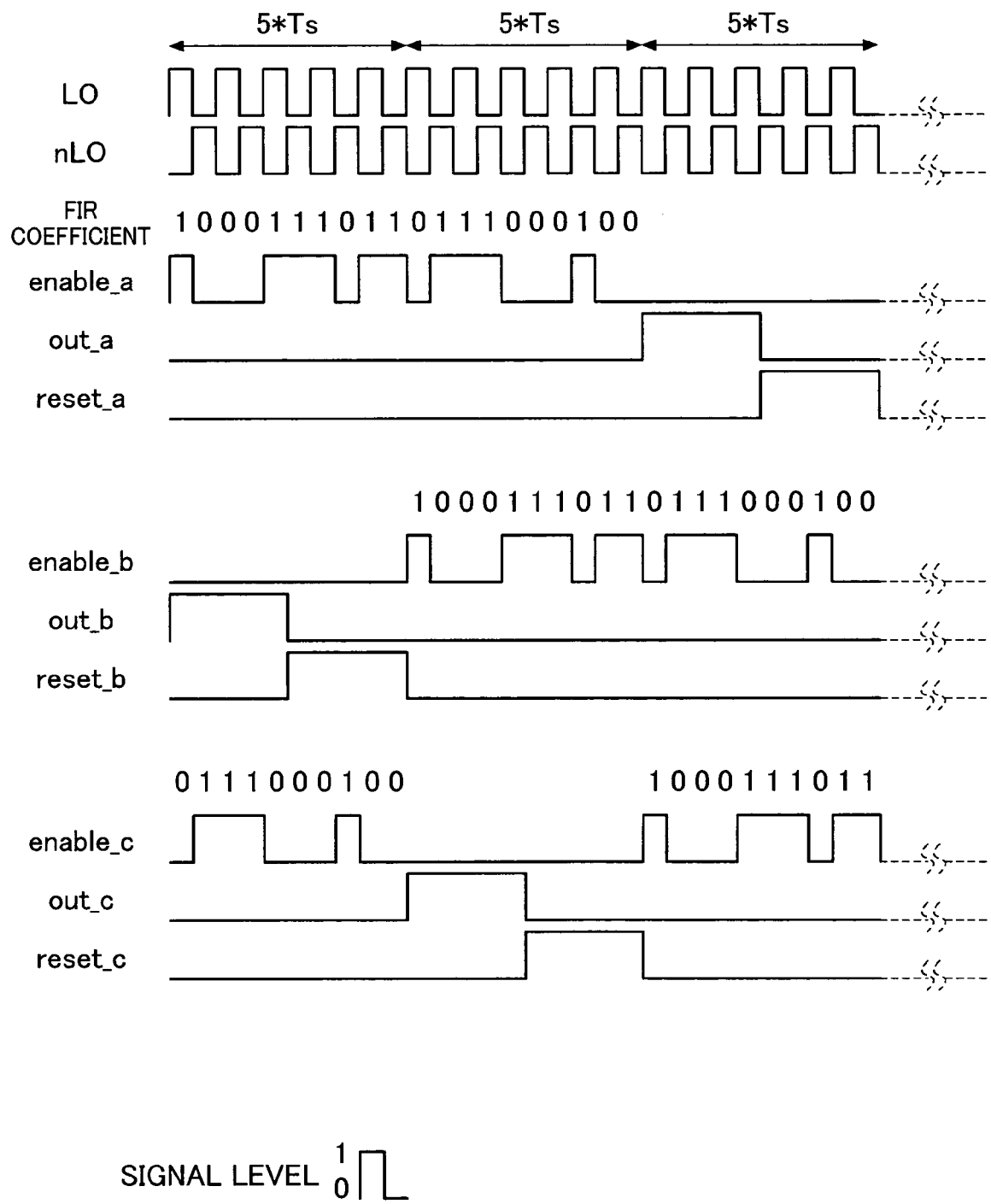
FIG. 6 is a timing chart illustrating timings of signals for the mixer in FIG. 2(a).
Figure 7:
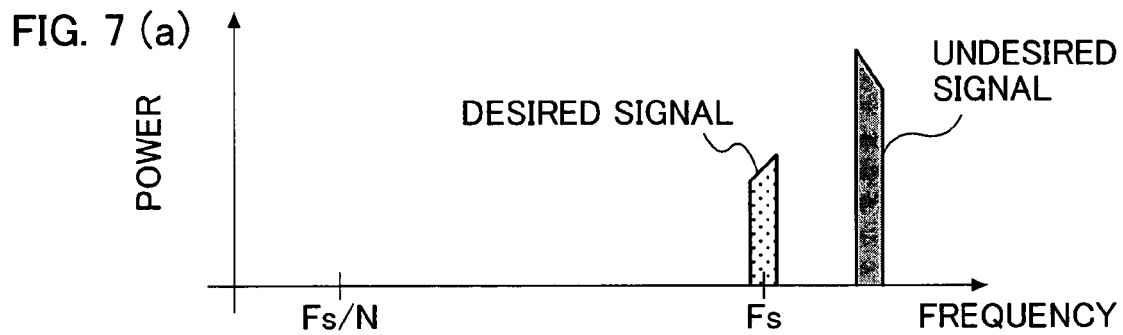
FIGS. 7(a) through 7(e) are spectrum drawings and a gain characteristic drawing for an FIR filter, illustrating the mixer in FIG. 2(a) attenuating an undesired signal.
Figure 7:
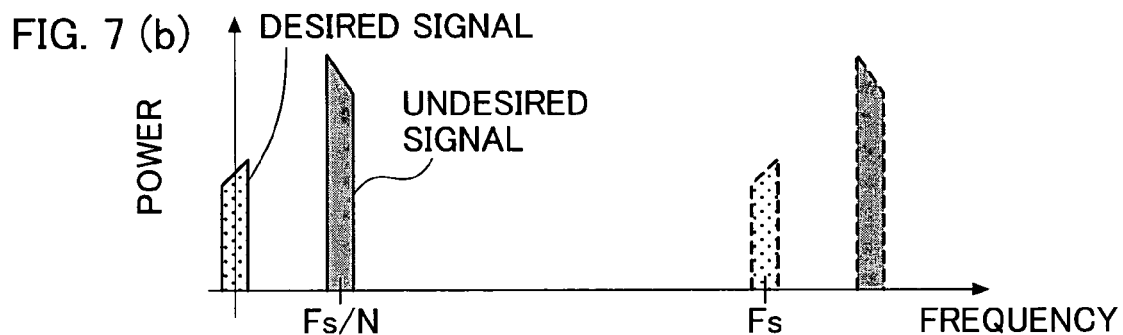
Figure 7:
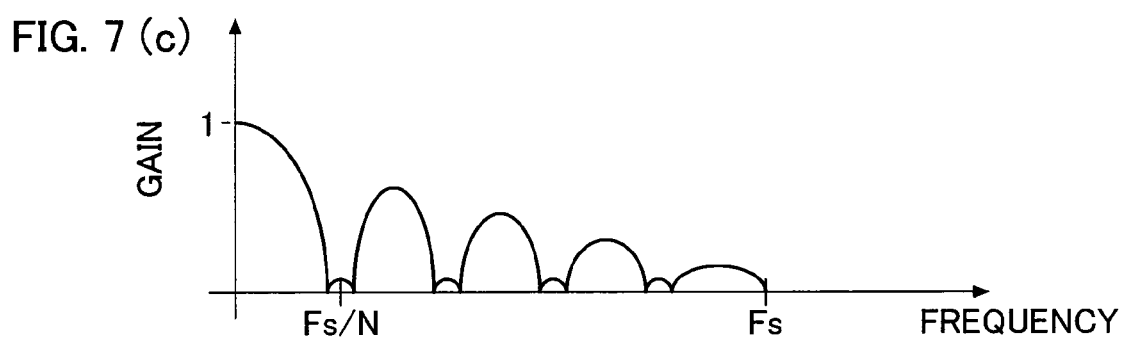
Figure 7:
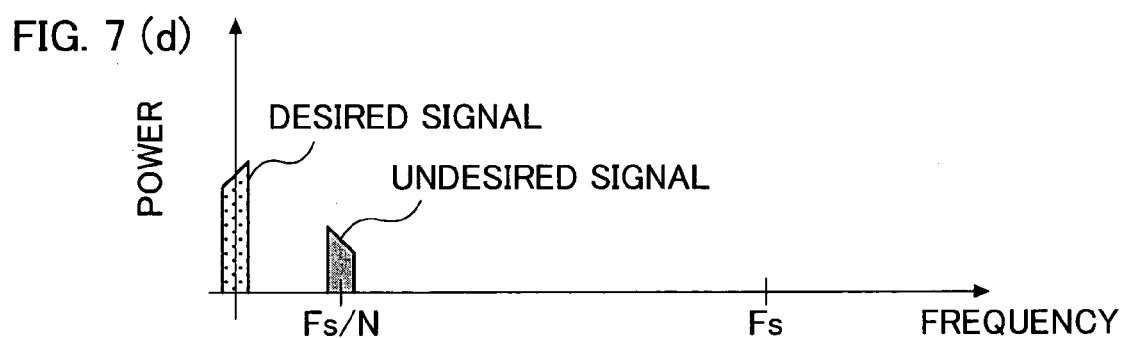
Figure 7:
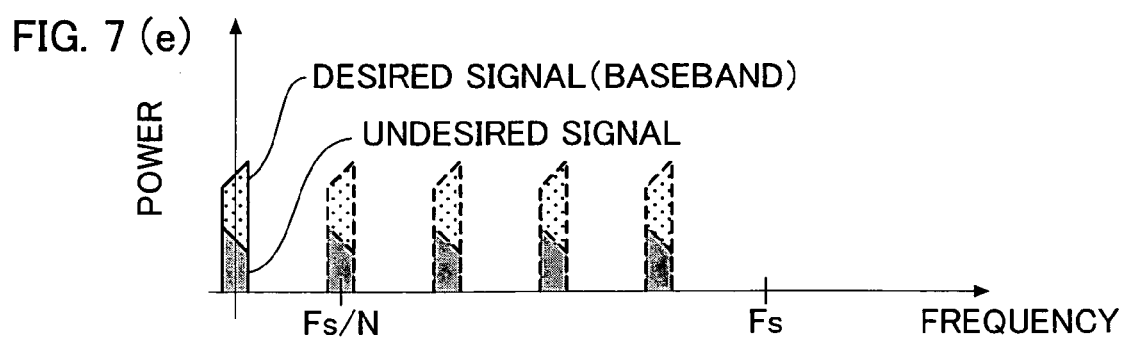
Figure 8:
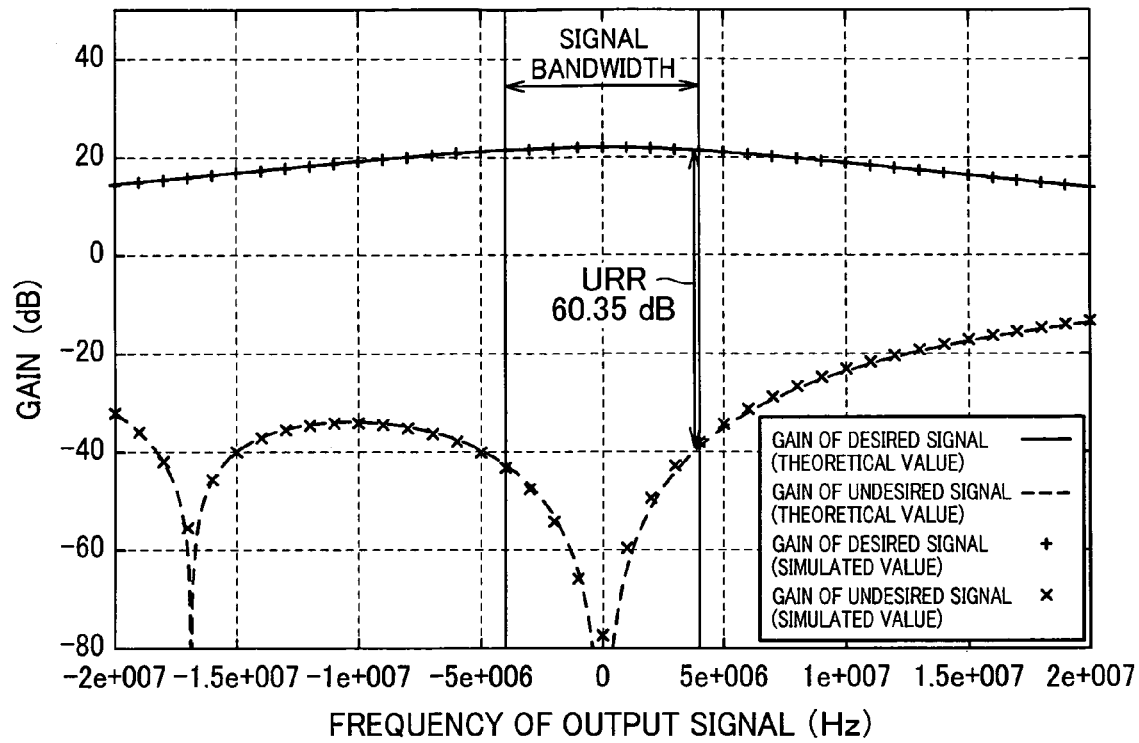
FIG. 8(a) is drawing illustrating a gain characteristic for a signal output of the mixer in FIG. 2(a).
FIG. 8(b) is a drawing illustrating a gain characteristic for a signal output of a conventional mixer.
Figure 8:
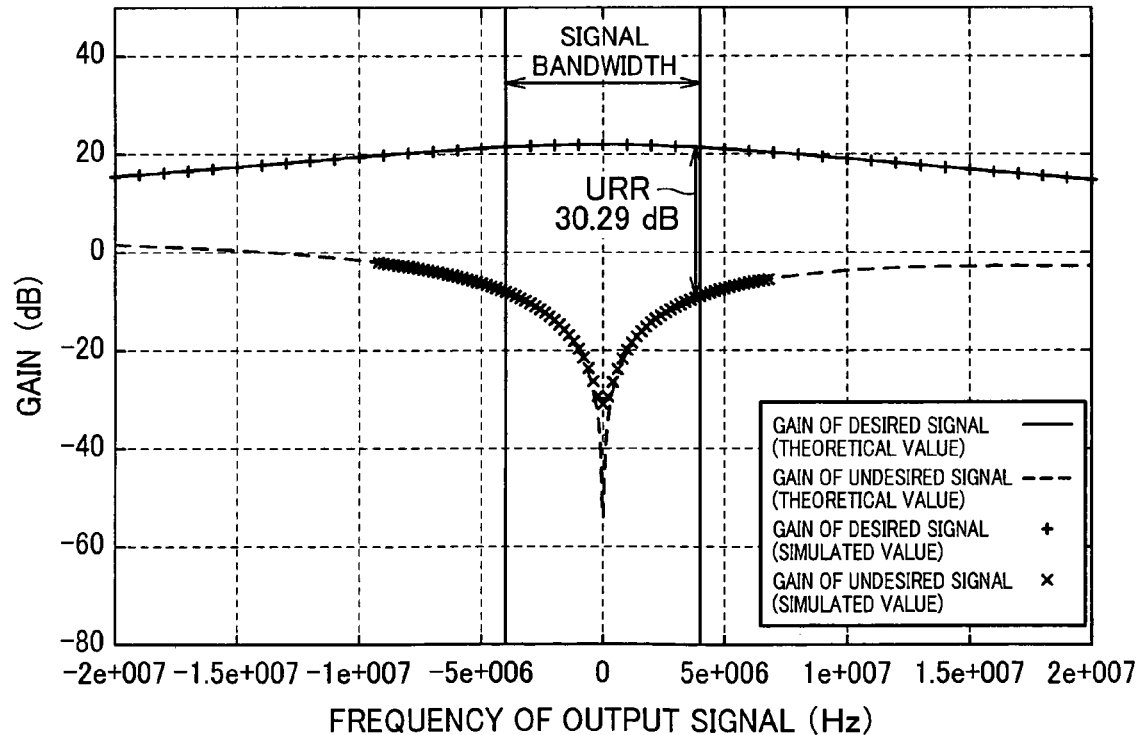

The current generating circuit 15 converts an RF signal input at the input terminal IN from voltage to current for an output. The current generating circuit 15 includes gm stages, one for each charge subsampling circuit 12, 13, 14 (detailed later). The timing generating block 11 generates two group of signals. A first group of signals 16 consists of signals commonly fed to all the charge subsampling circuits. In FIGS. 3, 5, and 6 (detailed later), the signals are signals LO, nLO. A second group of signals 17 consists of three signals respectively controlling the charge subsampling circuits. All the signals, except the signals LO, nLO, fall in this group. The three signal patterns for the second group of signals are identical. They are however supplied to the charge subsampling circuits with different phases. Generally, there are m charge subsampling circuits involved (m≧1); the present embodiment will describe operation where m=3 as an example.

The operation of the charge subsampling circuits 12 to 14 goes through three stages: i.e., integration, output, and resetting to list them sequentially. This is depicted in FIG. 2(a). Integration is a period (time period T1) termed an integration period ("Integrate") when the charge subsampling circuits 12 to 14 sample charge. Output, which comes after the integration, is a period (time period T2) termed an output period ("Out") when the stored charge is transferred to the output terminal OUT. Resetting, which comes after the output, is a period (time period T3) termed a reset period ("Reset") when the charge subsampling circuits 12 to 14 are discharged. In FIG. 2(a), "Integrate," "Out," and "Reset" have suffixes a, b, and c which correspond to the charge subsampling circuits 12 to 14 respectively.

By assigning the periods so that any one of the charge subsampling circuits goes through Out once in each duration of N×Ts, the output signal frequency is set to Fs/N. The signal can be downsampled by a factor of N. After the output, the circuits go through resetting and return to integration. The second group of signals 17 is adjusted in phase so that when one of the charge subsampling circuits starts output or resetting, the remaining charge subsampling circuits start integration. The sum of the integration period Integrate, the output period Out, and the reset period Reset equals m×N/Fs or m×N×Ts (here, 3×N/Fs or 3×N×Ts). That sum matches with the period of each timing pattern of the second group of signals 17.

FIG. 3 is a circuit diagram illustrating an exemplary arrangement of the charge subsampling circuits 12 to 14. All subsampling circuits have the same arrangement, so only the charge subsampling circuit 12 is shown. The charge subsampling circuit 12 is a succeeding stage of a gm stage 1201. The gm stage 1201 is provided in the current generating circuit 15 to generate current in proportion to an RF input voltage. The circuit 12 has parallel positive- and negative-side paths.

The positive-side path is equipped with, sequentially from the input side to the output side, an input switch (A first switch) 1202, an integration control switch (A second switch) 1204, a reset switch (A third switch) 1206, an integrating capacitor (first capacitor) 1208, and an output switch (A fourth switch) 1210. The input switch 1202, the integration control switch 1204, and the output switch 1210 are connected in series on the positive-side path. The reset switch 1206 and the integrating capacitor 1208 are connected at one end to the path between the integration control switch 1204 and the output switch 1210. The other ends are grounded (the GND, or a first reference voltage, is arbitrary, and so are other reference voltages). The positions of the reset switch 1206 and the integrating capacitor 1208 may be interchanged.

The negative-side path is equipped, sequentially from the input side to the output side, an input switch (A fifth switch) 1203, an integration control switch (A sixth switch) 1205, a reset switch (A seventh switch) 1207, an integrating capacitor (second capacitor) 1209, and an output switch (A eighth switch) 1211. The input switch 1203, the integration control switch 1205, and the output switch 1211 are connected in series on the negative-side path. The reset switch 1207 and the integrating capacitor 1209 are connected at one end to the path between the integration control switch 1205 and the output switch 1211. The other ends are grounded (GND, second reference voltage). The positions of the reset switch 1207 and the integrating capacitor 1209 may be interchanged.

The integrating capacitors 1208, 1209 have a capacitance of Ci.

Control signals supplied to the switches will be detailed later.

On the positive-side path, as the output switch 1210 is turned on, the integrating capacitor 1208 is connected to a plus output terminal 1212. Likewise, on the negative-side path, as the output switch 1211 is turned on, the integrating capacitor 1209 is connected to a minus output terminal 1213. The positive-side path and the plus output terminal 1212 form the positive side of the charge subsampling circuit 12. The negative-side path and the minus output terminal 1213 form the negative side of the charge subsampling circuit 12. An output signal is a voltage difference (differential signal) between the plus output terminal 1212 and the minus output terminal 1213.

Figure 4:
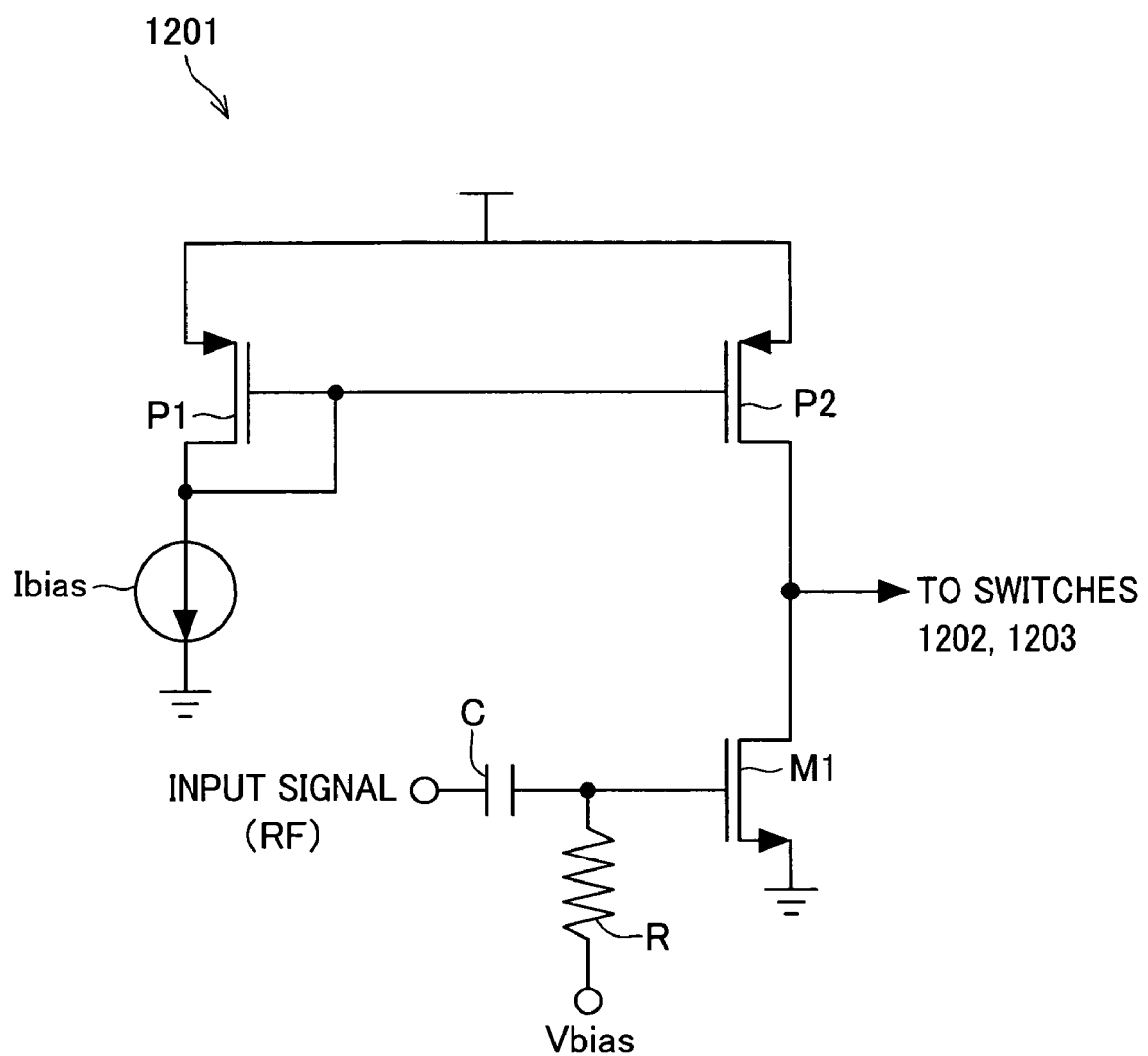
FIG. 4 is a circuit diagram illustrating the arrangement of a gm stage in the mixers shown in FIG. 1(a) and FIG. 2(a).

FIG. 4 is a circuit diagram illustrating an exemplary arrangement of the gm stage 1201 in FIG. 3. The gm stage 1201 includes a current source Ibias, p-channel MOS transistors P1 and P2, an n-channel MOS transistor M1, an input capacitor C, and a biasing resistor R. The MOS transistors P1 and P2 form a current mirror. An input signal (RF), plus the bias voltage Vbias, is coupled to gate of the MOS transistor M1 through the capacitor C and resistor R. The drain of the MOS transistor P1 is coupled to the current source Ibias. The gate of the MOS transistor P1 is coupled to the gate of the MOS transistor P2. The drain of the MOS transistor P2 is coupled to the drain of the MOS transistor M1. The gm stage output is drawn from a common connection of the drains.

FIG. 5 is a circuit diagram illustrating the arrangement of the charge subsampling mixer 1 including the three charge subsampling circuits 12 to 14. Output capacitors 101, 102 are coupled to the output terminals OUT. The timing generating block 11 is omitted in the figure. The charge subsampling circuits 12, 13, and 14 have the same structure as the charge subsampling circuit 12. An RF input signal is supplied to each charge subsampling circuit 12 to 14. The plus output terminals of the charge subsampling circuits 12 to 14 are connected together to provide an Out₊ output for the charge subsampling mixer 1. The minus output terminals are connected together to provide an Out₋ output for the charge subsampling mixer 1. The output capacitor 101 is connected to the Out₊ output. The output capacitor 102 is connected to the Out₋ output. The voltage difference (differential signal) between the Out₊ output and the Out_ output is the output signal for the charge subsampling circuit 1. The output capacitors 101, 102 have a capacitance of Co.

FIG. 6 shows exemplary control signals generated by the timing generating block 11 for supply to the switches in FIG. 3 and FIG. 5 detailed above.

Assume that when a signal in the figure changes to 1, the switch controlled by the signal turns on. Conversely, when the signal changes to 0, the switch turns off.

In addition, throughout the rest of the present embodiment, the signal LO is a first rectangular signal, the signal nLO is a second rectangular signal, the signal "enable" is an A first digital signal, the signal "out" is an A second digital signal, the signal "reset" is an A third digital signal.

The signals LO, nLO are set to a frequency of Fs and out of phase by 180 degrees. The signal LO controls all the input switches 1202, 1302, 1402 on the positive side of the charge subsampling circuits 12 to 14. The signal nLO controls all the input switches 1203, 1303, 1403 on the negative side of the charge subsampling circuits 12 to 14.

The signal enable_a controls the integration control switches 1204, 1205 in the charge subsampling circuit 12. The signal enable_b controls the integration control switches 1304, 1305 in the charge subsampling circuit 13. The signal enable_c controls the integration control switches 1404, 1405 in the charge subsampling circuit 14.

The signal out_a controls the output switches 1210, 1211 in the charge subsampling circuit 12. The signal out_b controls the output switches 1310, 1311 in the charge subsampling circuit 13. The signal out_c controls the output switches 1410, 1411 in the charge subsampling circuit 14.

The signal reset_a controls the reset switches 1206, 1207 in the charge subsampling circuit 12. The signal reset_b controls the reset switches 1306, 1307 in the charge subsampling circuit 13. The signal reset_c controls the reset switches 1406, 1407 in the charge subsampling circuit 14.

In each integration period Integrate, the signal enable repeatedly switches between 1 and 0, whilst the signals reset and out are 0. In each output period Out, the signal out is 1, whilst the signals enable and reset are 0. In each reset period Reset, the signal reset is 1, whilst the signals enable and out are 0.

This example involves three charge subsampling circuits (i.e., m=3). The signals are all set to a period of 3×N×Ts. In addition, in this example, N=5. The output period Out is preferably as long as possible to reliably transfer charge stored in the integrating capacitors to the output capacitors 101, 102. Also, the reset period Reset is preferably as long as possible to completely discharge the integrating capacitors after the output period Out. In the present embodiment, both the output period Out and the reset period Reset are set to N/2×Ts (=0.5×N/Fs), whereas the integration period Integrate is set to 2×N×Ts. Generally, the integration period Integrate is (m−1)×N×Ts.

In accordance with the periods, the signals reset_a, reset_b, and reset_c, as well as the signals out_a, out_b, and out_c, are 1 in each time period of N/2×Ts (=0.5×N/Fs). The signals enable_a, enable_b, and enable_c alternate between 1 and 0 in a predetermined sequence in each 2×N×Ts period and stay at 0 in the remaining N×Ts period. The signals enable, reset, and out have an identical basic pattern. The signals enable_b, reset_b, and out_b lag the signals enable_a, reset_a, and out_a respectively by N×Ts. The signals enable_c, reset_c and out_c lag the signals enable_b, reset_b, and out_b respectively by N×Ts.

The pattern of 0s and 1s of the signal enable in the integration period Integrate determines the properties of an FIR filter. The following will describe effects.

Analyzing the same way as with conventional art, the charge stored in the sampling period Ts is given by the formula:

$$Q_{out}(f) = \frac{T_s}{2} \text{sinc}\left(\pi \cdot f \frac{T_s}{2}\right) \cdot Ic(f) \cdot \sum_{k=0}^{M-1} a_k z^{-k}$$

In the equation, $$e^{j\frac{T_s}{2}\pi \cdot f}$$

is neglected. Also in the expression, z is defined as follows:

$$z = e^{j2\pi \cdot f \cdot T_s/2}$$

$a_k$ in the $Q_{out}(f)$ formula takes either 0 or 1 in response to the value of the signal enable. M is the order of the FIR filter. In the example shown in FIG. 6, $\{a_0, \ldots, a_{19}\} = \{0, 0, 1, 0, 0, 0, 1, 1, 1, 0, 1, 1, 0, 1, 1, 1, 0, 0, 0, 1\}$. In the charge subsampling circuit, the output signal of the gm stage is sampled N times in the positive side and another N times in the negative side in the N×Ts time period, which means that the output signal is sampled a total of 2×N times. From these settings, the integration period Integrate is (m−1)×N×Ts; the order of the FIR filter is calculated by:

$$M = 2 \cdot (m-1) \cdot N$$

In the present embodiment, M=20. That is, there are 20 patterns of 0s and 1s for the signal enable in the integration period Integrate in the timing chart of FIG. 6.

Accordingly, the output is given by:

$$V_o(f) = \frac{gm}{C_i} \frac{T_s}{2} \text{sinc}\left(\pi \cdot f \frac{T_s}{2}\right) \cdot FIR \cdot IIR \cdot V_{in}(f)$$

where $$IIR = \frac{z^{-2N}}{1 + \frac{C_o}{C_i}(1 - z^{-2N})}$$

Undesired signals are attenuated as shown in FIGS. 7(a) to 7(e) depending on the values of the coefficients $a_k$ for the FIR filter. Determining each signal enable to be 1 or 0 is equivalent to determining a coefficient $a_k$ for the FIR filter to be 1 or 0. In the filtering with the FIR filter, this translates to weighting of terms in the transfer function of the FIR filter with a set of weights, each either a 0 or a 1. FIGS. 7(a), 7(b) are identical to FIGS. 26(a), 26(b) described earlier. FIG. 7(c) shows a gain characteristic of the FIR filter of the present embodiment. FIG. 7(d) illustrates the FIR filter having attenuated undesired signals. When compared to the conventional case, the undesired signals are greatly attenuated across their bandwidth (bandwidth which is aliased to the desired signal bandwidth) in the present embodiment. FIG. 7(e) illustrates a base band signal being filtered by means of the differential output signal in FIG. 5.

Hence, according to the present embodiment, a base band signal is obtainable from a signal of a wide bandwidth without being affected by noise or undesired signals.

The weighting in the filtering with the FIR filter, or filter coefficient settings, is not limited to the foregoing example. Alternatives include:

$\{a_0, \ldots, a_{19}\} = \{1, 0, 1, 0, 1, 1, 1, 1, 1, 1, 0, 1, 0, 1, 0, 0, 0, 0, 0, 0\}$, and $\{a_0, \ldots, a_{19}\} = \{1, 0, 0, 1, 1, 0, 1, 1, 1, 1, 0, 1, 1, 0, 0, 1, 0, 0, 0, 0\}$.

A computer program may be used to determine the pattern. Using a computer program, one can calculate the attenuation of undesired signals for all different patterns of the FIR coefficients, for example, to find a pattern which delivers large attenuation.

The above two patterns include a continuous string of 0s on the right. Therefore, the following patterns, formed by shifting the patterns to the right, have the same characteristics, although producing different input/output latency:

$\{a_0, \ldots, a_{19}\} = \{0, 1, 0, 1, 0, 1, 1, 1, 1, 1, 1, 0, 1, 0, 1, 0, 0, 0, 0, 0\}$ $\{a_0, \ldots, a_{19}\} = \{0, 0, 0, 1, 0, 1, 0, 1, 1, 1, 1, 1, 1, 0, 1, 0, 1, 0, 0, 0\}$ Now, move on to FIG. 8(a) showing calculations from the foregoing theoretical formula for a gain characteristic of the charge subsampling mixer 1 shown in FIGS. 2(a) and 2(b). FIG. 8(a) also shows results of circuit simulation with ideal elements. The horizontal axis of the graph represents the output frequency of the charge subsampling mixer 1 in hertz. The vertical axis represents the gain by the subsampling mixer in dB. Parameters were set for the simulation as follows:

gm=1 mS
Ci=Co=500 pF
N=5
M=20
$\{a_0, \ldots, a_{19}\} = \{0, 0, 1, 0, 0, 0, 1, 1, 1, 0, 1, 1, 0, 1, 1, 1, 0, 0, 0, 1\}$ (same as in FIG. 6)
Fs=506 MHz
Signal bandwidth=8 MHz (Fc +/−4 MHz)

The frequency parameter was determined from television tuner specifications. With these parameter settings, the carrier frequency for a first undesired signal is Fs+Fs/N, and the first undesired signal is from 603.2 to 611.2 MHz, for the desired signal of 502 to 510 MHz. Fed with a signal in such a range of frequency, the subsampling mixer produces an output in a +/−4 MHz range.

In FIG. 7(a) showing results of a simulation for the present embodiment, the upper line and points on the line indicate gains for a desired signal, whereas the lower line and the points on the line indicate those for an undesired signal. The gains indicated by the lines were calculated from the formula. Those indicated by the points are results of the simulation. The vertical lines at +4 MHz and −4 MHz indicate the edges of the signal bandwidth. A minimum difference between the gain of the desired signal and that of the undesired signal is about 60 dB. This value is the rejection ratio of the undesired signal (undesired rejection ratio, hereinafter "URR").

For a comparison, FIG. 7(b) shows results of simulation of a conventional charge subsampling mixer using the same parameters. In this simulation, URR is about 30 dB.

Here is an application example. A DVB-H receiver overall needs an URR of 75 dB according to its specifications. If the conventional charge subsampling mixer is used, a filter in a preceding stage of the charge subsampling mixer needs to attenuate by 45 dB an undesired signal separated by 100 MHz from a desired signal. In contrast, if the charge subsampling mixer of the present embodiment is used, an input filter only needs to attenuate by 15 dB an undesired signal separated by 100 MHz from a desired signal. It is easier in the embodiment than in conventional cases to provide a filter in a preceding stage of the charge subsampling mixer.

The description so far has dealt with a concrete example where there are three charge subsampling circuits. As could be understood from the description, the number of charge subsampling circuits (=m) is arbitrary. FIG. 1(a) shows the arrangement of a charge subsampling mixer 5 where m=1. The charge subsampling mixer 5 includes a timing generating block (control circuit) 6, a charge subsampling circuit 7, and a current generating circuit (current source) 8. The output capacitor coupled to the output terminal OUT is omitted in FIG. 1(a).

The current generating circuit 8 converts an RF signal input at the input terminal IN from voltage to current for an output. The circuit 8 includes one gm stage 1201 shown in FIGS. 2(a) and (b). The timing generating block 6 generates two group of signals. A first group of signals 9 is similar to the first group of signals 16 shown in FIG. 2(a). A second group of signals is similar to a signal of the second group of signals 17 which is supplied to one of the charge subsampling circuits in FIG. 2(a). FIG. 1(b) shows a sequence for the second group of signals 10. The meanings of the symbols and the sequence are the same as in FIG. 2(b).

Figure 9:
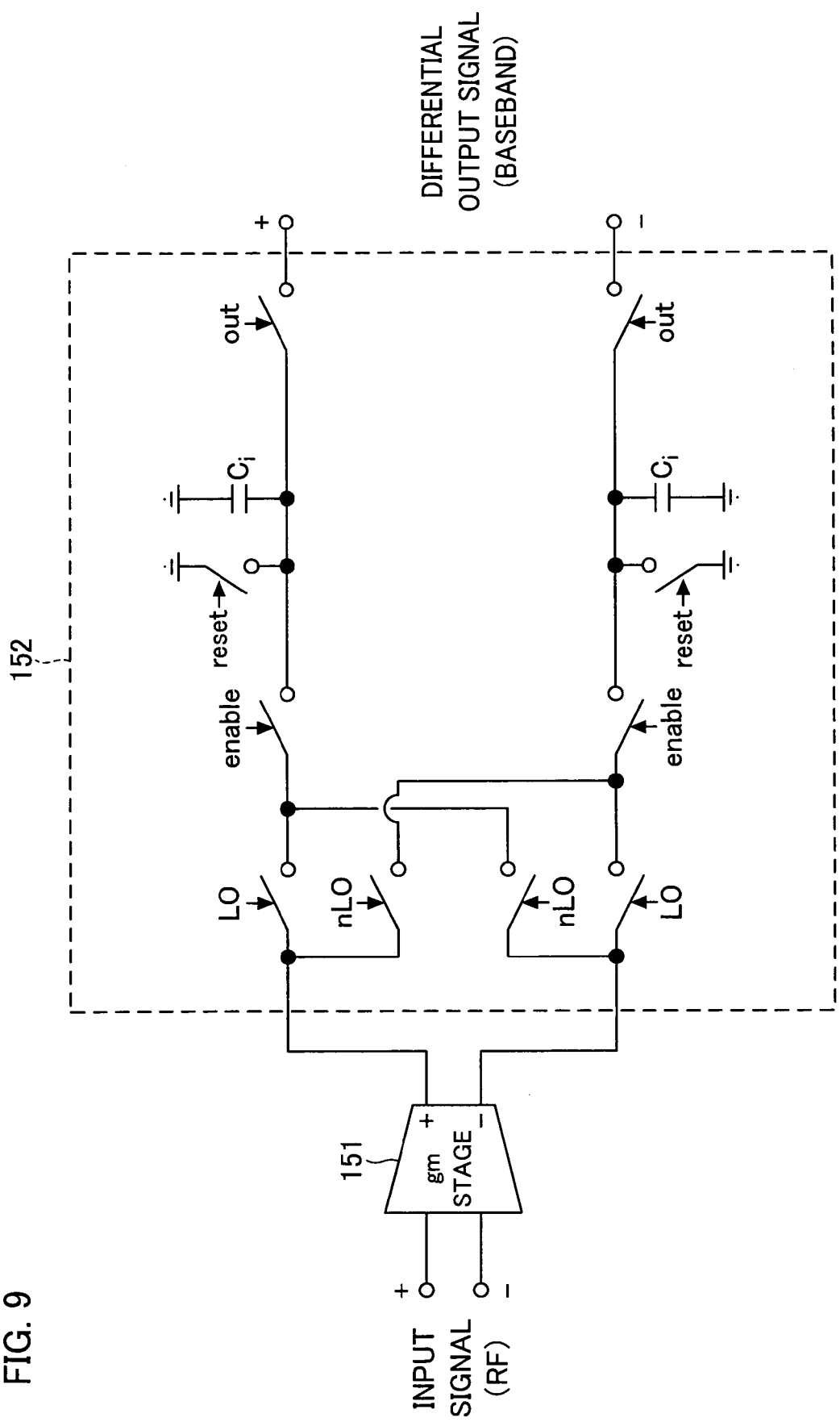
FIG. 9 is a circuit block diagram illustrating a part of the arrangement of a mixer when the input signal is a differential signal.

The present embodiment has so far dealt with the input signal (RF) and the gm stage output signal which are single-ended signals. The signals may be differential signals. FIG. 9 shows a part of a charge subsampling mixer for differential signals. In FIG. 9, the input signal is a differential signal. Accordingly, the gm stage 151 is supplied with a differential input and produces a differential output. In the charge subsampling circuit 152, when LO is 1, the positive side of the differential output is coupled to the switch enable on the positive side, and the negative side of the differential output is coupled to the switch enable on the negative side. When LO is 0, the positive side of the differential output of the gm stage is coupled to the switch enable on the negative side, and the negative side of the differential output is coupled to the switch enable on the positive side. If an input signal is supplied as a differential signal, adverse effects from a second-order distortion and common mode noise can be reduced.

In addition, according to the present embodiment, current sources like the current generating circuits 8, 15, have as many current outputs as charge subsampling circuits for each input signal (RF), so that each output can be coupled to a different input of the charge subsampling circuits. Accordingly, no matter how many charge subsampling circuits are involved. the current source is able to supply the individual charge subsampling circuits with suitable current in accordance with the input signal.

According to the present embodiment, in current sources like the current generating circuits 8, 15, gm stages, one for each current output, generate current. Therefore, each gm stage needs to supply current to only one charge subsampling circuit. There is no need for large output power.

Embodiment 2

Figure 10:
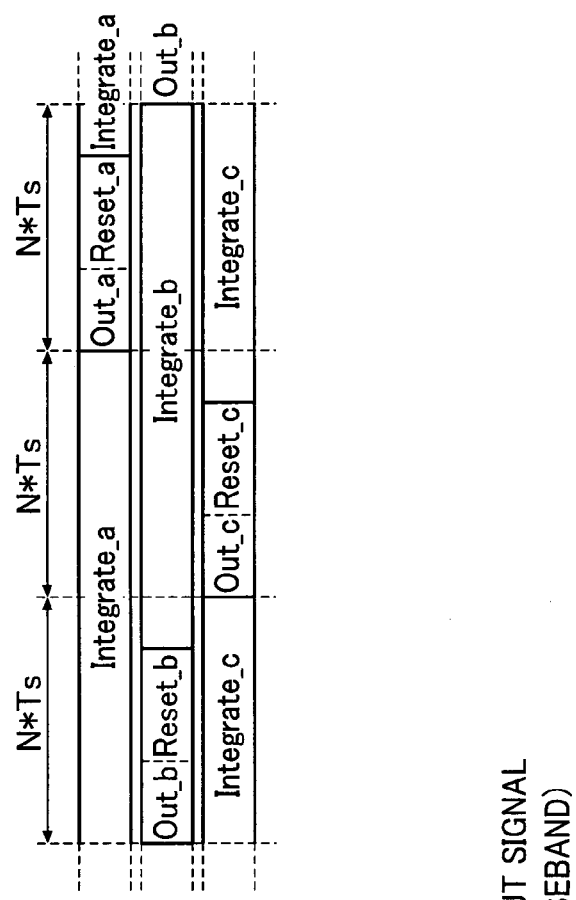
FIG. 10(a) is a block diagram illustrating the arrangement of a mixer in accordance with a second embodiment of the present invention.
FIG. 10(b) is a drawing showing a period for a signal generated by a timing generating block in the mixer.
Figure 10:
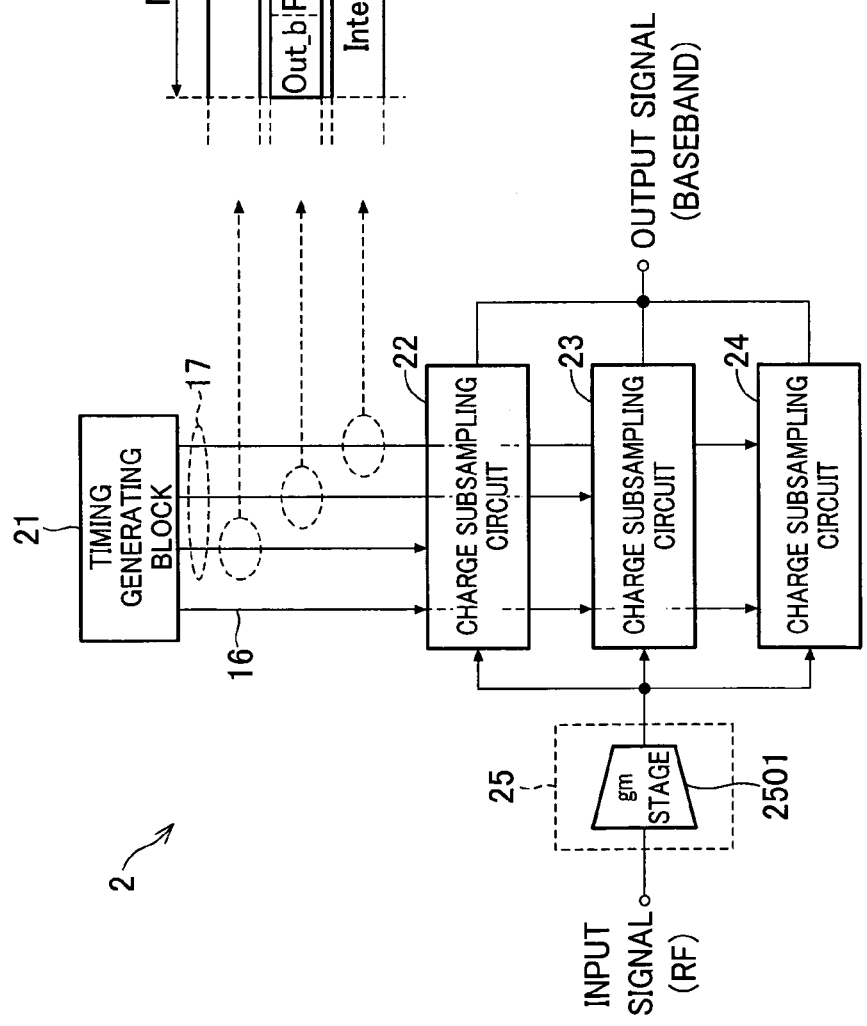
Figure 11:
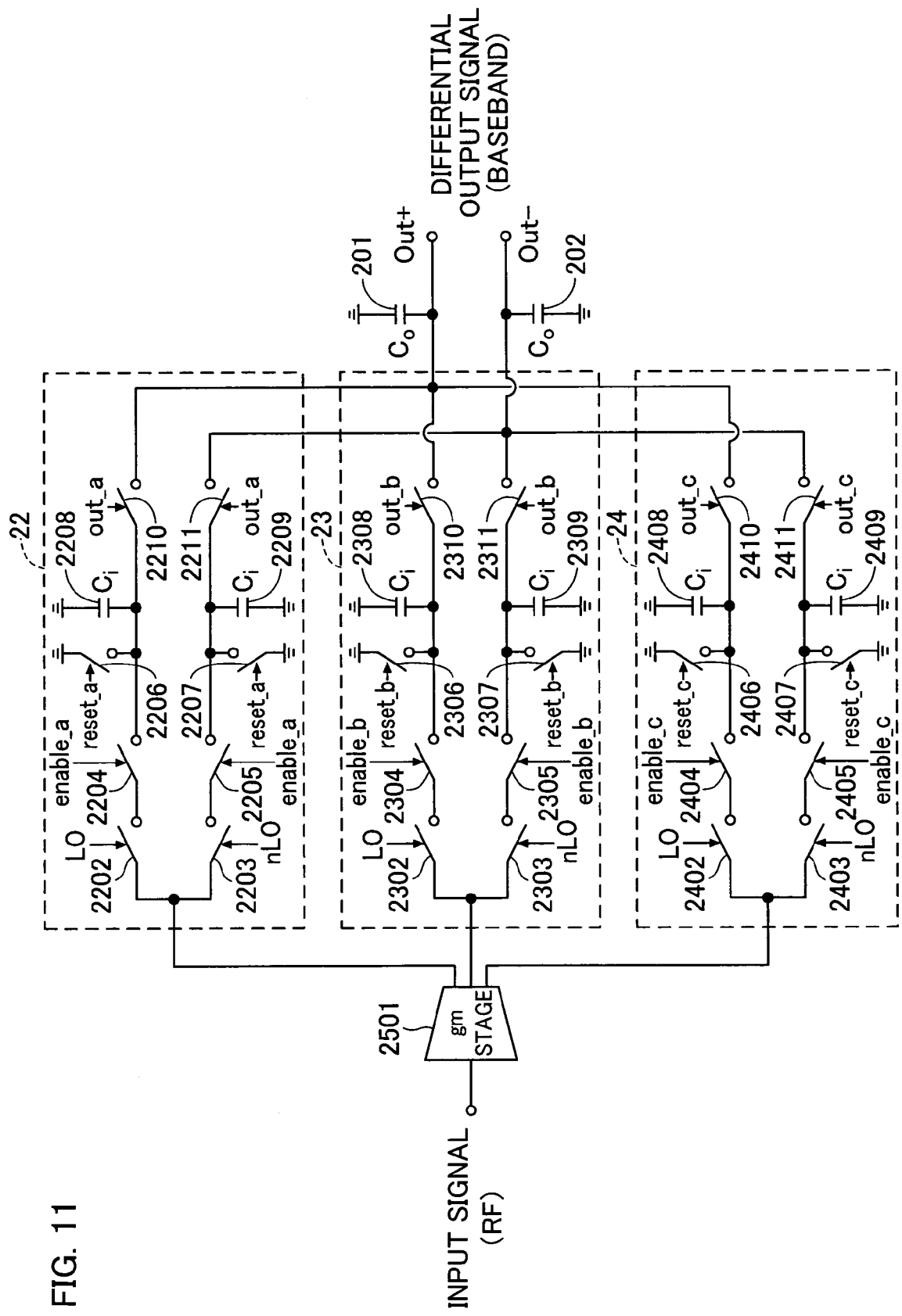
FIG. 11 is a circuit block diagram illustrating the mixer in FIGS. 10(a) and 10(b) by way of a detailed structural drawing of a charge subsampling circuit.

The following will describe another embodiment of the present invention in reference to FIGS. 10(a), 10(b), and 11. Here, for convenience, members of the present embodiment that have the same arrangement and function as members of embodiment 1, and that are mentioned in that embodiment are indicated by the same reference numerals and description thereof is omitted.

FIG. 10(*a*) is an illustration of the arrangement of the charge subsampling mixer 2 in accordance with the present embodiment. The charge subsampling mixer 2 includes a timing generating block (control circuit) 21, three charge subsampling circuits 22 to 24, and a current generating circuit (current source) 25. The output capacitors coupled to the output terminals OUT are omitted in FIG. 10(*a*).

Figure 1:
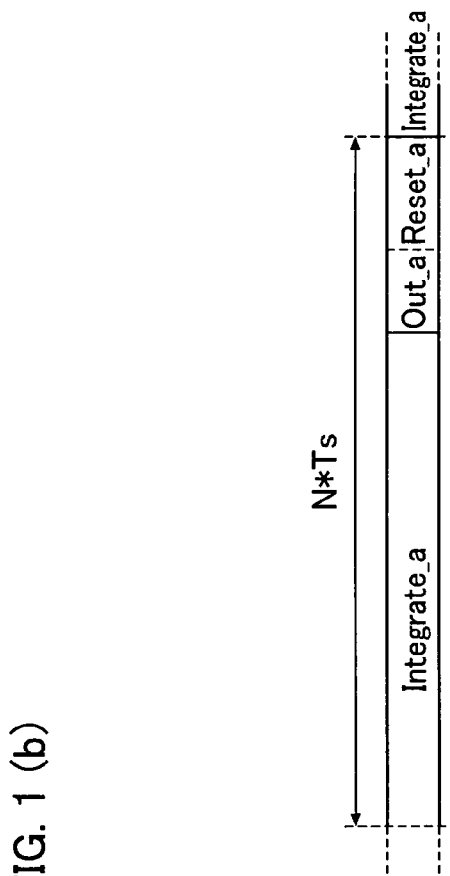
FIG. 1(a) is a block diagram illustrating the arrangement of a first mixer in accordance with a first embodiment of the present invention.
FIG. 1(b) is a drawing showing a period for a signal generated by a timing generating block in the mixer.
Figure 1:
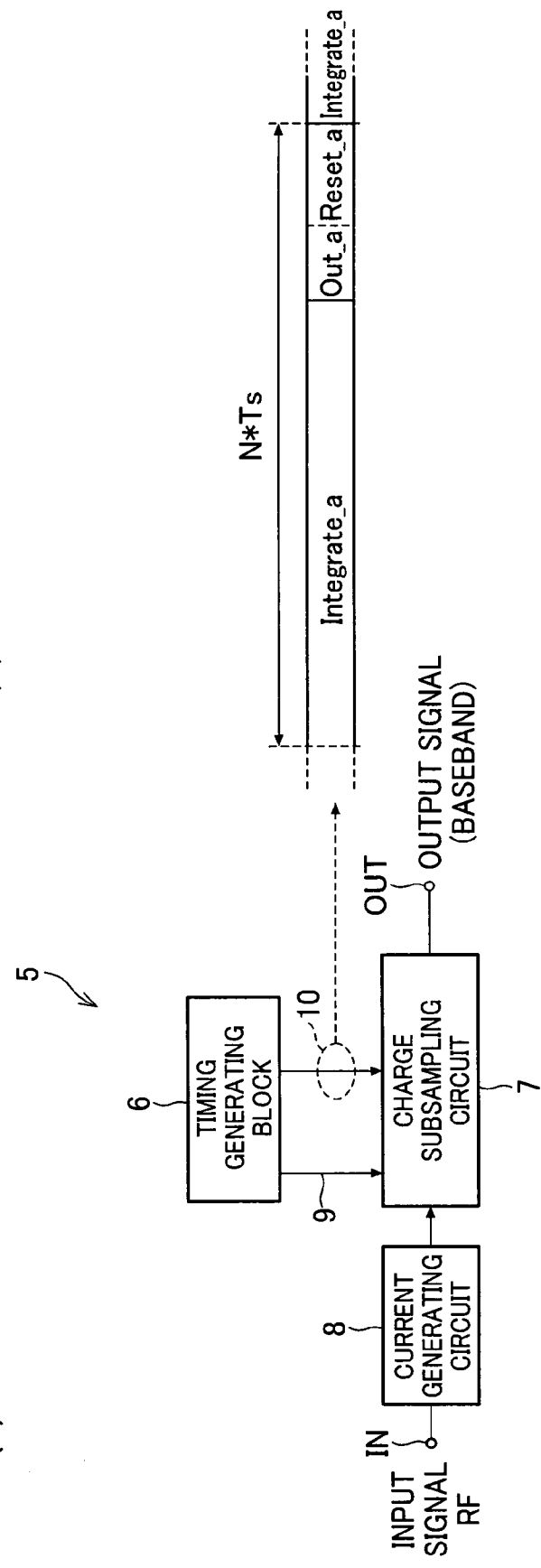
Figure 2:
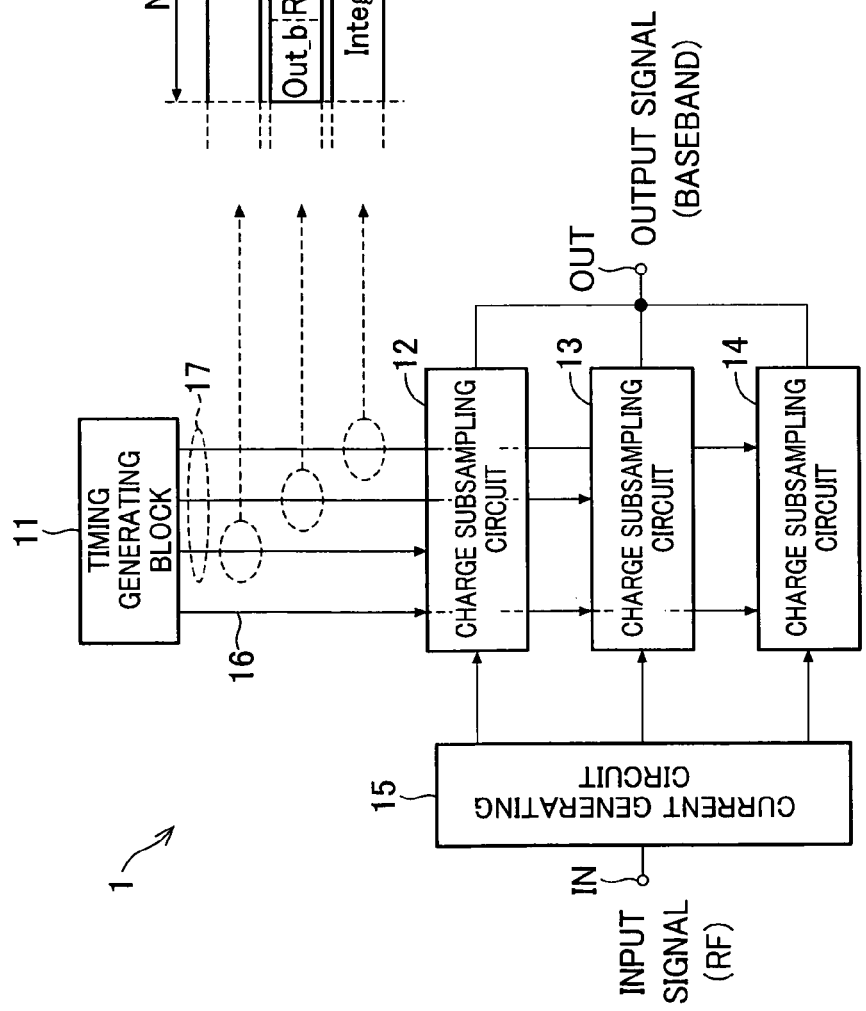
FIG. 2(a) is a block diagram illustrating the arrangement of a second mixer in accordance with the first embodiment of the present invention.
FIG. 2(b) is a drawing showing a period for a signal generated by a timing generating block in the mixer.
Figure 2:
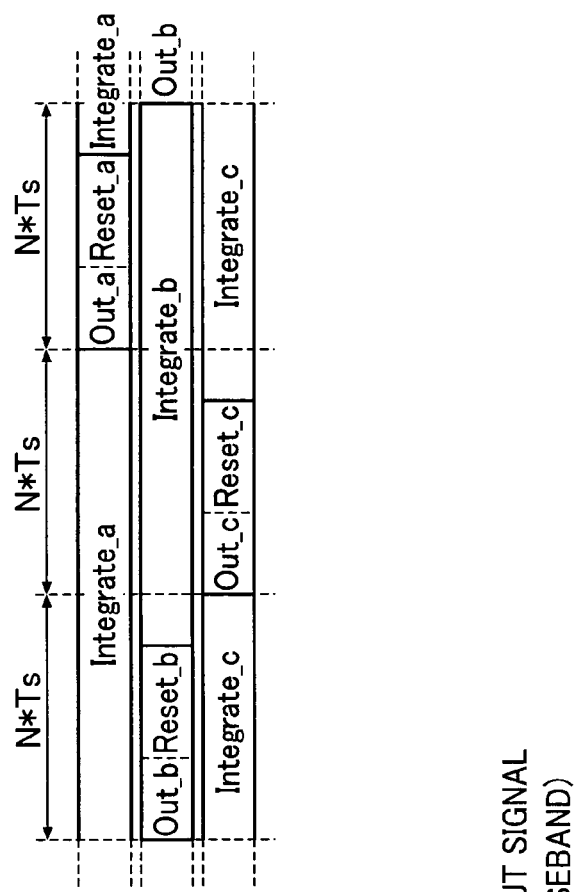

The timing generating block 21 is the same as the timing generating block 11 in FIGS. 2(*a*) and 2(*b*), generating the first group of signals 16 and the second group of signals 17. FIG. 10(*b*) shows the sequence followed by the second group of signals 17. The meanings of the symbols and the sequence are the same as in FIG. 2(*b*). The charge subsampling circuits 22 to 24 are the same as the charge subsampling circuits 12 to 14 in FIGS. 2(*a*) and 2(*b*). The current generating circuit 25 contains only one gm stage 2501. The three charge subsampling circuits 22 to 24 are connected in parallel and commonly coupled to the output of the gm stage 2501 for an input.

FIG. 11 is a circuit diagram illustrating the arrangement of the charge subsampling mixer 2 in detail. As shown in FIG. 11, similarly to FIG. 5, each charge subsampling circuit 22 to 24 includes an input switch controlled by the signals LO and nLO, an integration control switch controlled by a signal enable, an reset switch controlled by a signal reset, an integrating capacitor, and an output switch controlled by a signal out.

The signal LO controls all the input switches 2202, 2302, 2402 on the positive side of the charge subsampling circuits 22 to 24. The signal nLO controls all the input switches 2203, 2303, 2403 on the negative side of the charge subsampling circuits 22 to 24.

The signal enable_a controls the integration control switches 2204, 2205 in the charge subsampling circuit 22. The signal enable_b controls the integration control switches 2304, 2305 in the charge subsampling circuit 23. The signal enable_c controls the integration control switches 2404, 2405 in the charge subsampling circuit 24.

The signal out_a controls the output switches 2210, 2211 in the charge subsampling circuit 22. The signal out_b controls the output switches 2310, 2311 in the charge subsampling circuit 23. The signal out_c controls the output switches 2410, 2411 in the charge subsampling circuit 14.

The signal reset_a controls the reset switches 2206, 2207 in the charge subsampling circuit 22. The signal reset_b controls the reset switches 2306, 2307 in the charge subsampling circuit 23. The reset_c controls the reset switches 2406, 2407 in the charge subsampling circuit 24.

An output capacitor 201 is coupled to the output terminal Out$_+$. An output capacitor 202 is coupled to the output terminal Out$_-$. The voltage difference between the output terminal Out$_+$ and the output terminal Out$_-$ is the output signal (differential signal).

Employing the same switching timing pattern in the present embodiment as the pattern in FIG. 6 produces the same effects as in embodiment 1. The present embodiment uses only one gm stage. This reduces circuit size and improves on path matching when compared to embodiment 1. A manufactured circuit in some cases does not have the designed size. Paths could therefore be different. For example, when there are used two gm stages, their transconductances may differ, which in turn causes path mismatching.

Embodiment 3

Figure 12:
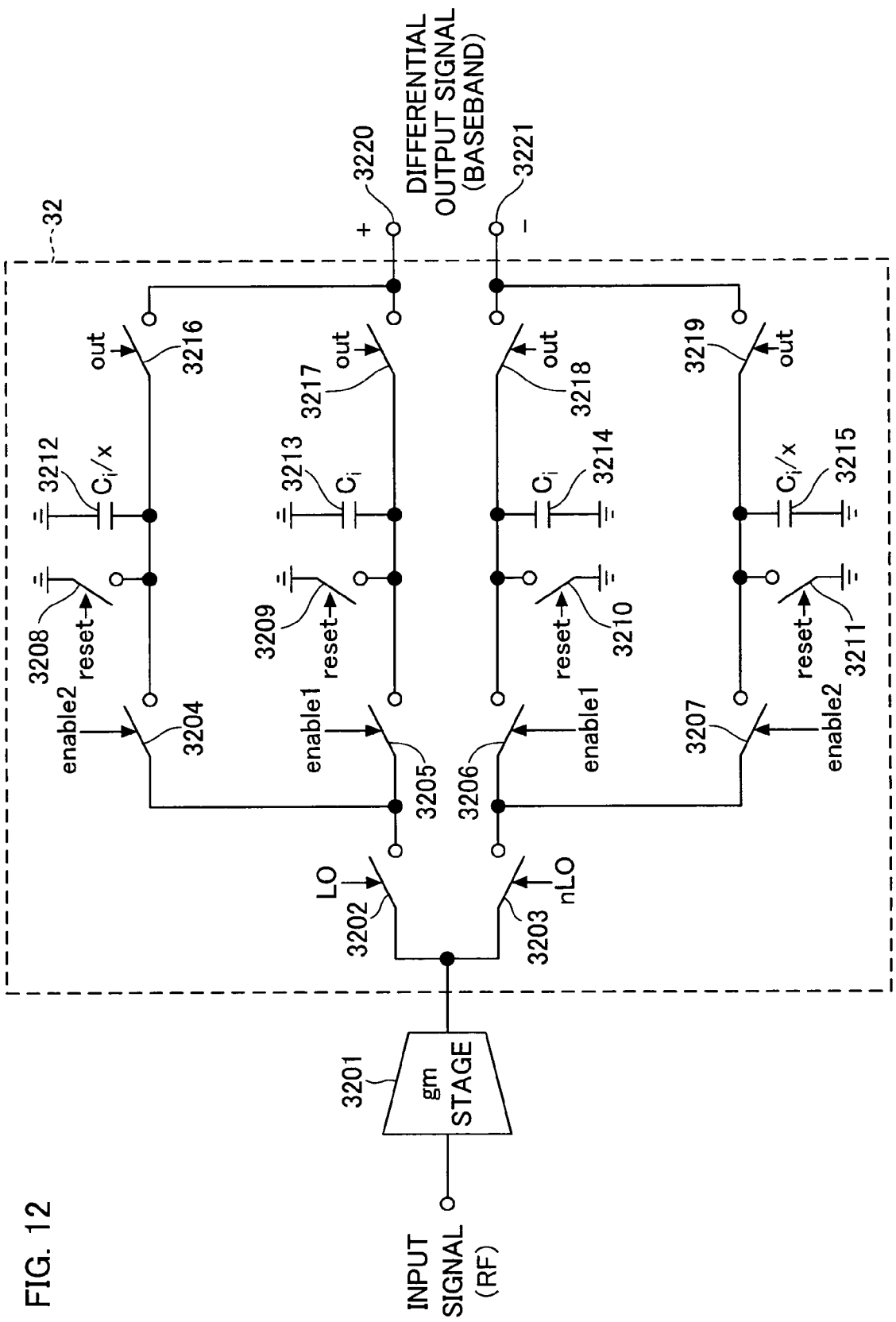
FIG. 12 is a circuit block diagram illustrating the arrangement of a charge subsampling circuit in a mixer in accordance with a third embodiment of the present invention.
Figure 13:
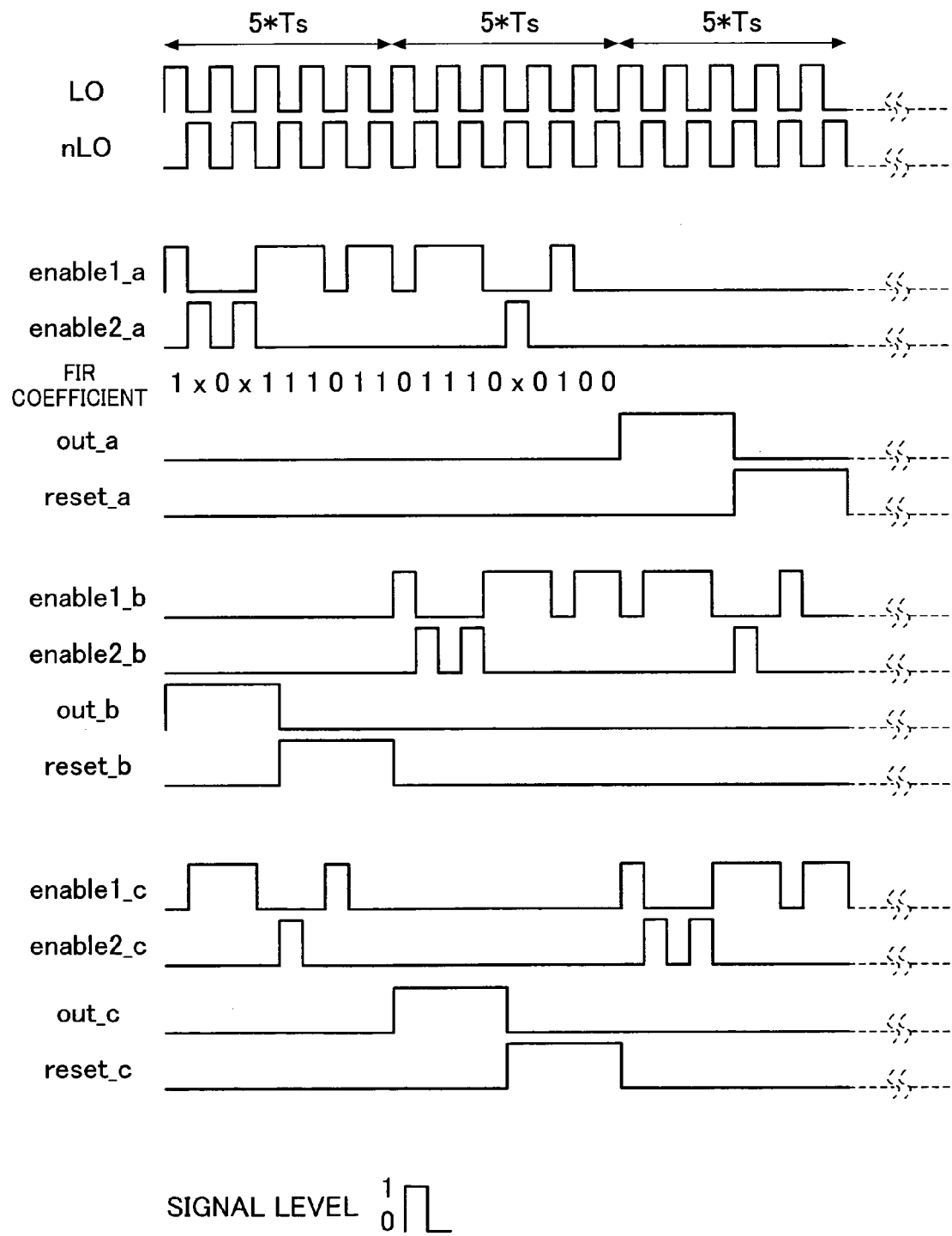
FIG. 13 is a timing chart illustrating timings of signals for the mixer in FIG. 12.

The following will describe another embodiment of the present invention in reference to FIG. 12 and FIG. 13. Here, for convenience, members of the present embodiment that have the same arrangement and function as members of embodiment 1 or 2, and that are mentioned in that embodiment are indicated by the same reference numerals and description thereof is omitted.

FIG. 12 shows a part of the arrangement of a charge subsampling mixer in accordance with the present embodiment. The charge subsampling mixer includes three parallel pairs of a gm stage 3201 and a charge subsampling circuit 32 as in the arrangement shown in FIG. 5 for embodiment 1. The three gm stages 3201 form a current generating circuit (current source). Also, the mixer includes a similar timing generating block to the timing generating block 11 in FIGS. 2(*a*) and 2(*b*) as a timing generating block (control circuit).

The gm stage 3201 generates current in proportion to the voltage of the input signal (RF). The charge subsampling circuit 32 has a positive-side path and a negative-side path. The positive-side path includes an input switch (B first switch) 3202 connecting the path to the output of the gm stage 3201. The negative-side path includes an input switch (B second switch) 3203 connecting the path to the output of the gm stage 3201. Furthermore, the positive-side path branches into parallel paths, a first positive-side path and a second positive-side path, between the input switch 3202 and the plus output terminal 3220. The negative-side path branches into parallel paths, a first negative-side path and a second negative-side path, between the input switch 3203 and the minus output terminal 3221.

The first positive-side path is equipped, sequentially from the input side to the output side, with a first integration control switch (B third switch) 3205, a first reset switch (B fourth switch) 3209, a first integrating capacitor (first capacitor) 3213, and a first output switch (B fifth switch) 3217. The first integration control switch 3205 and the first output switch 3217 are connected in series on the first positive-side path. The first reset switch 3209 and the first integrating capacitor 3213 are connected at one end to respective points between the first integration control switch 3205 and the first output switch 3217. The other ends are grounded (GND, a first reference voltage). The positions of the first reset switch 3209 and the first integrating capacitor 3213 may be interchanged.

The second positive-side path is equipped, sequentially from the input side to the output side, with a second integration control switch (B sixth switch) 3204, a second reset switch (B seventh switch) 3208, a second integrating capacitor (second capacitor) 3212, and a second output switch (B eighth switch) 3216. The second integration control switch 3204 and the second output switch 3216 are connected in series on the second positive-side path. The second reset switch 3208 and the second integrating capacitor 3212 are connected at one end to respective points between the second integration control switch 3204 and the second output switch 3216. The other ends are grounded (GND, a second reference voltage). The positions of the second reset switch 3208 and the second integrating capacitor 3212 may be interchanged.

The first negative-side path is equipped, sequentially from the input side to the output side, with a first integration control switch (B ninth switch) 3206, a first reset switch (B tenth switch) 3210, a first integrating capacitor (third capacitor) 3214, and a first output switch (B eleventh switch) 3218. The first integration control switch 3206 and the first output switch 3218 are connected in series on the first negative-side path. The first reset switch 3210 and the first integrating capacitor 3214 are connected at one end to respective points between the first integration control switch 3206 and the first output switch 3218. The other ends are grounded (GND, a third reference voltage). The positions of the first reset switch 3210 and the first integrating capacitor 3214 may be interchanged.

The second negative-side path is equipped, sequentially from the input side to the output side, with a second integration control switch (B twelfth switch) 3207, a second reset switch (B thirteenth switch) 3211, a second integrating capacitor (fourth capacitor) 3215, and a second output switch (B fourteenth switch) 3219. The second integration control switch 3207 and the second output switch 3219 are connected in series on the second negative-side path. The second reset switch 3211 and the second integrating capacitor 3215 are connected at one end to respective points between the second integration control switch 3207 and the second output switch 3219. The other ends are grounded (GND, a fourth reference voltage). The positions of the second reset switch 3219 and the second integrating capacitor 3215 may be interchanged.

As the first output switch 3217 and the second output switch 3216 are turned on, the first integrating capacitor 3213 and the second integrating capacitor 3216 are connected to the plus output terminal 3220. Likewise, as the first output switch 3218 and the second output switch 3219 are turned on, the first integrating capacitor 3214 and the second integrating capacitor 3215 are connected to the minus output terminal 3221. The voltage difference between the plus output terminal 3220 and the minus output terminal 3221 is the output signal (differential signal).

FIG. 13 shows an exemplary timing diagram for the control signals of the present embodiment.

Throughout the rest of the present embodiment, the signal LO is the first rectangular signal, the signal nLO is the second rectangular signal, the signal enable 1 is the B first digital signal, the signal enable 2 is the B second digital signal, the signal out is the B third digital signal, and the signal reset is the B fourth digital signal.

The present embodiment differs from embodiment 1 in that there are two signals enable 1 and enable 2 for each charge subsampling circuit. The signal LO controls the input switch 3202. The signal nLO controls the input switch 3203. The signal enable 1 controls the first integration control switches 3205, 3206. The signal enable 2 controls the second integration control switches 3204, 3207. The FIR coefficients can be switched between three values by prohibiting the signal enable 1 and the signal enable 2 from simultaneously being 1 and setting the first integrating capacitors 3213, 3214 and the second integrating capacitors 3212, 3215 to different values. If the capacitance of the first integrating capacitors 3213, 3214 is set to Ci, and the capacitance of the second integrating capacitors 3212, 3215 is set to Ci/k, the FIR coefficient is selectable from 0, 1, and k.

In the filtering with the FIR filter, these settings translate to weighting of the terms with a set of weights, each selected from a 1, a 0, and a k.

Besides, the signal reset controls the first reset switches 3209, 3210 and the second reset switches 3208, 3211. The signal out controls the first output switches 3217, 3218 and the second output switches 3216, 3219. These signals are provided for each of the three charge subsampling circuits, which are separately denoted by "a," "b," and "C."

The present embodiment allows for use of more FIR coefficients, making it easier to realize a suitable FIR filter for a specific application.

Furthermore, by increasing the number of integrating capacitors, it is possible to increase the values of coefficients.

In addition, it is also possible to use only one gm stage as in embodiment 2.

Embodiment 4

Figure 14:
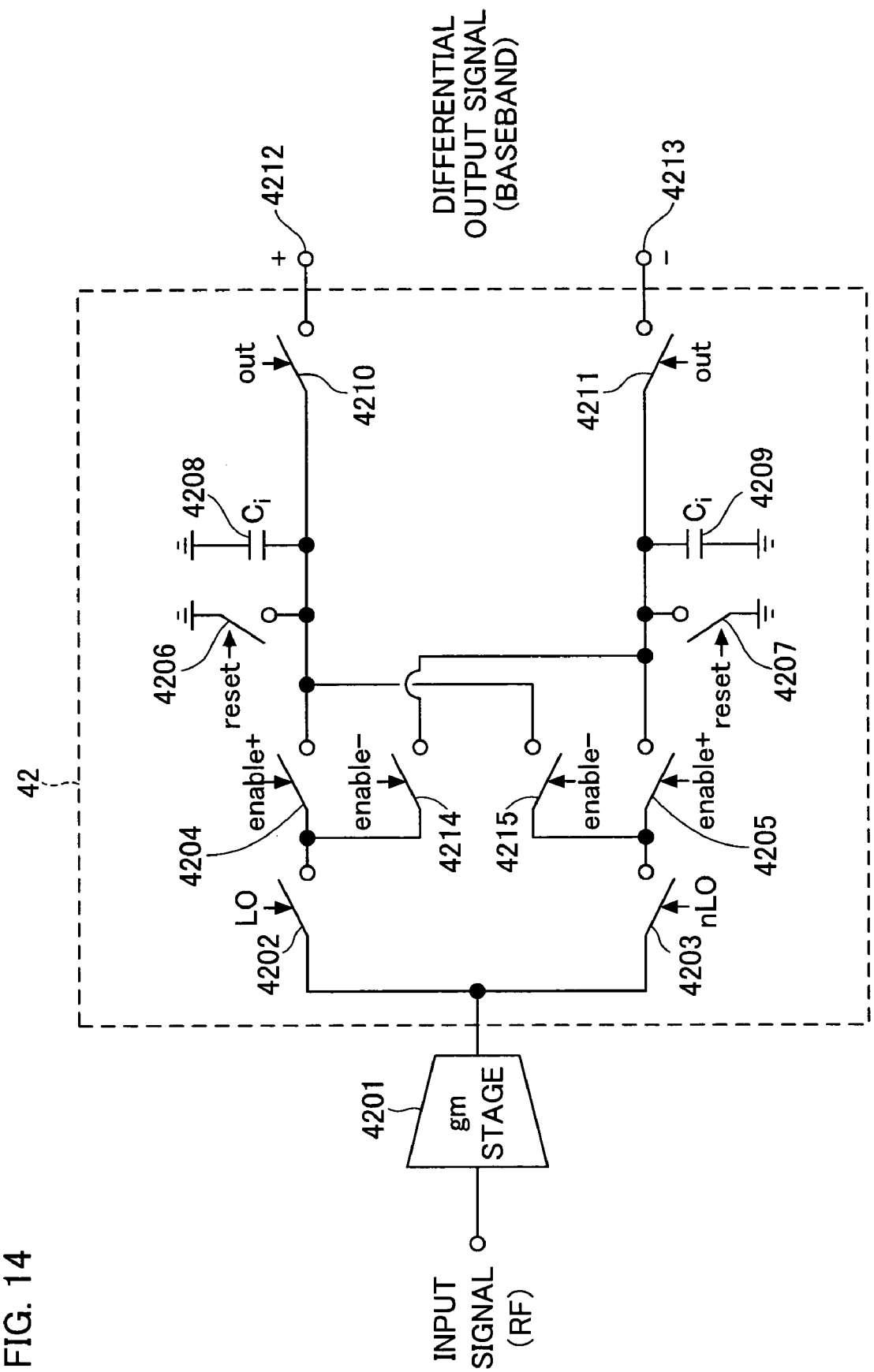
FIG. 14 is a circuit block diagram illustrating the arrangement of a charge subsampling circuit in the mixer in accordance with the third embodiment of the present invention.
Figure 15:
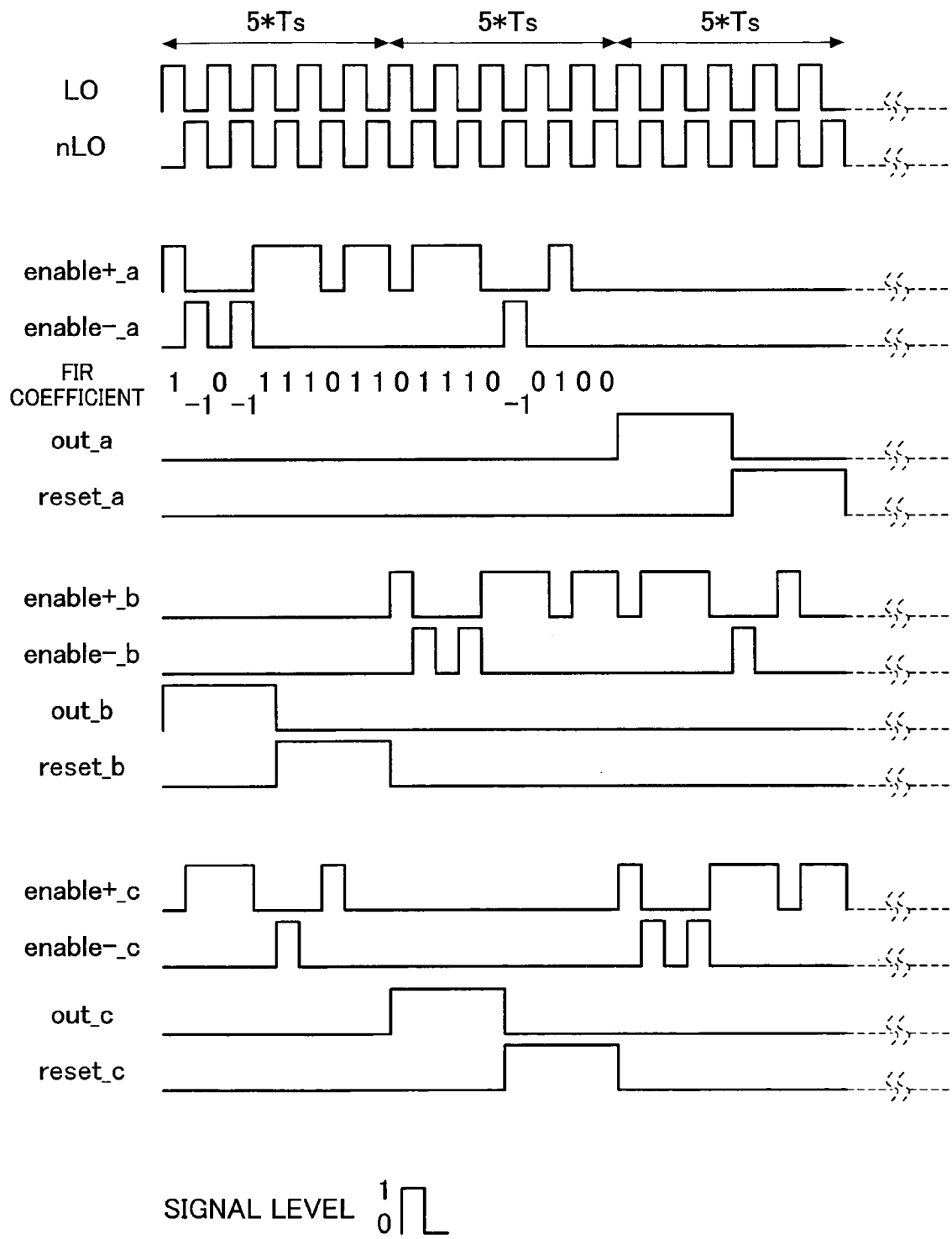
FIG. 15 is a timing chart illustrating timings of signals for the mixer in FIG. 14.

The following will describe another embodiment of the present invention in reference to FIG. 14 and FIG. 15. Here, for convenience, members of the present embodiment that have the same arrangement and function as members of embodiment 1, 2, or 3, and that are mentioned in that embodiment are indicated by the same reference numerals and description thereof is omitted.

FIG. 14 shows a part of the arrangement of a charge subsampling mixer in accordance with the present embodiment. The charge subsampling mixer includes three parallel pairs of a gm stage 4201 and a charge subsampling circuit 42 as in the arrangement shown in FIG. 5 for embodiment 1. The three gm stage 4201 form a current generating circuit (current source). Also, the mixer includes a similar timing generating block to the timing generating block 11 in FIGS. 2(*a*) and 2(*b*) as a timing generating block (control circuit).

The gm stage 4201 generates current in proportion to the voltage of the input signal (RF). The charge subsampling circuit 42 has: an input switch (C first switch) 4202 and an input switch (C second switch) 4203; a first positive-side path and a second negative-side path coupled via the input switch 4202 to the output of the gm stage 4201; and a first negative-side path and a second positive-side path coupled via the input switch 4203 to the output of the gm stage 4201.

The first positive-side path is equipped, sequentially from the input side to the output side between the input switch 4202 and the plus output terminal 4212, with a first integration control switch (C third switch) 4204, a reset switch (C fourth switch) 4206, an integrating capacitor (first capacitor) 4208, and an output switch (C fifth switch) 4210. The first integration control switch 4204 and the output switch 4210 are connected in series on the first positive-side path. The reset switch 4206 and the integrating capacitor 4208 are connected at one end to respective points between the first integration control switch 4202 and the output switch 4210. The other ends are grounded (GND, first reference voltage). The positions of the reset switch 4206 and the integrating capacitor 4208 may be interchanged.

The first negative-side path is equipped with, sequentially from the input side to the output side between the input switch 4203 and the minus output terminal 4213, with a first integration control switch (C sixth switch) 4205, a reset switch (C seventh switch) 4207, an integrating capacitor (second capacitor) 4209, and an output switch (C eighth switch) 4211. The first integration control switch 4205 and the output switch 4211 are connected in series on the first negative-side path. The reset switch 4207 and the integrating capacitor 4209 are connected at one end to respective points between the first integration control switch 4205 and the output switch 4211. The other ends are grounded (GND, second reference voltage). The positions of the reset switch 4207 and the integrating capacitor 4209 may be interchanged.

The second positive-side path is equipped, sequentially from the input side to the output side between the input switch 4203 and the plus output terminal 4212, with a second integration control switch (C tenth switch) 4215, a reset switch 4206, an integrating capacitor 4208, and an output switch 4210. The reset switch 4206, the integrating capacitor 4208, and the output switch 4210 are common to the first positive-side path and the second positive-side path. The second integration control switch 4215 and the output switch 4210 are connected in series on the second positive-side path.

The second negative-side path is equipped, sequentially from the input side to the output side between the input switch 4202 and the minus output terminal 4212, with a second integration control switch (C ninth switch) 4214, a reset switch 4207, an integrating capacitor 4209, and an output switch 4211. The second integration control switch 4214, the reset switch 4207, the integrating capacitor 4209, and the output switch 4211 are common to the first negative-side path and the second negative-side path. The second integration control switch 4214 and the output switch 4211 are connected in series on the second negative-side path.

The integrating capacitors 4208, 4209 have a capacitance of Ci.

As the output switch 4210 is turned on, the integrating capacitor 4208 is connected to the plus output terminal 4212. Likewise, as the output switch 4211 is turned on, the integrating capacitor 4209 is connected to the minus output terminal 4213. The voltage difference between the plus output terminal 4212 and the minus output terminal 4213 is the output signal (differential signal).

FIG. 15 is an exemplary timing diagram for the control signals of the present embodiment.

Throughout the rest of the present embodiment, the signal LO is the first rectangular signal, the signal nLO is the second rectangular signal, the signal enable$^+$ is the C first digital signal, the signal enable$^-$ is the C second digital signal, the signal out is the C third digital signal, the signal reset is the C fourth digital signal.

The present embodiment differs from embodiment 1 in that there are two signals enable$^+$ and enable$^-$ for each charge subsampling circuit. The signal enable$^+$ and the signal enable$^-$ are prohibited from simultaneously being 1. Changing the signal enable$^+$ to 1 turns on the first integration control switches 4204, 4205 and switching an FIR coefficient to +1. Conversely, changing the signal enable$^-$ to 1 turns on the second integration control switches 4214, 4215 and switching an FIR coefficient to −1. In addition, changing both to 0, an FIR coefficient switches to 0. Overall, three FIR filter coefficients are produced.

The present embodiment allows for use of more FIR coefficients, making it possible to realize a suitable FIR filter for a specific application.

In addition, it is also possible to use only one gm stage as in embodiment 2.

The present embodiment can be combined with embodiment 3.

Embodiment 5

Figure 16:
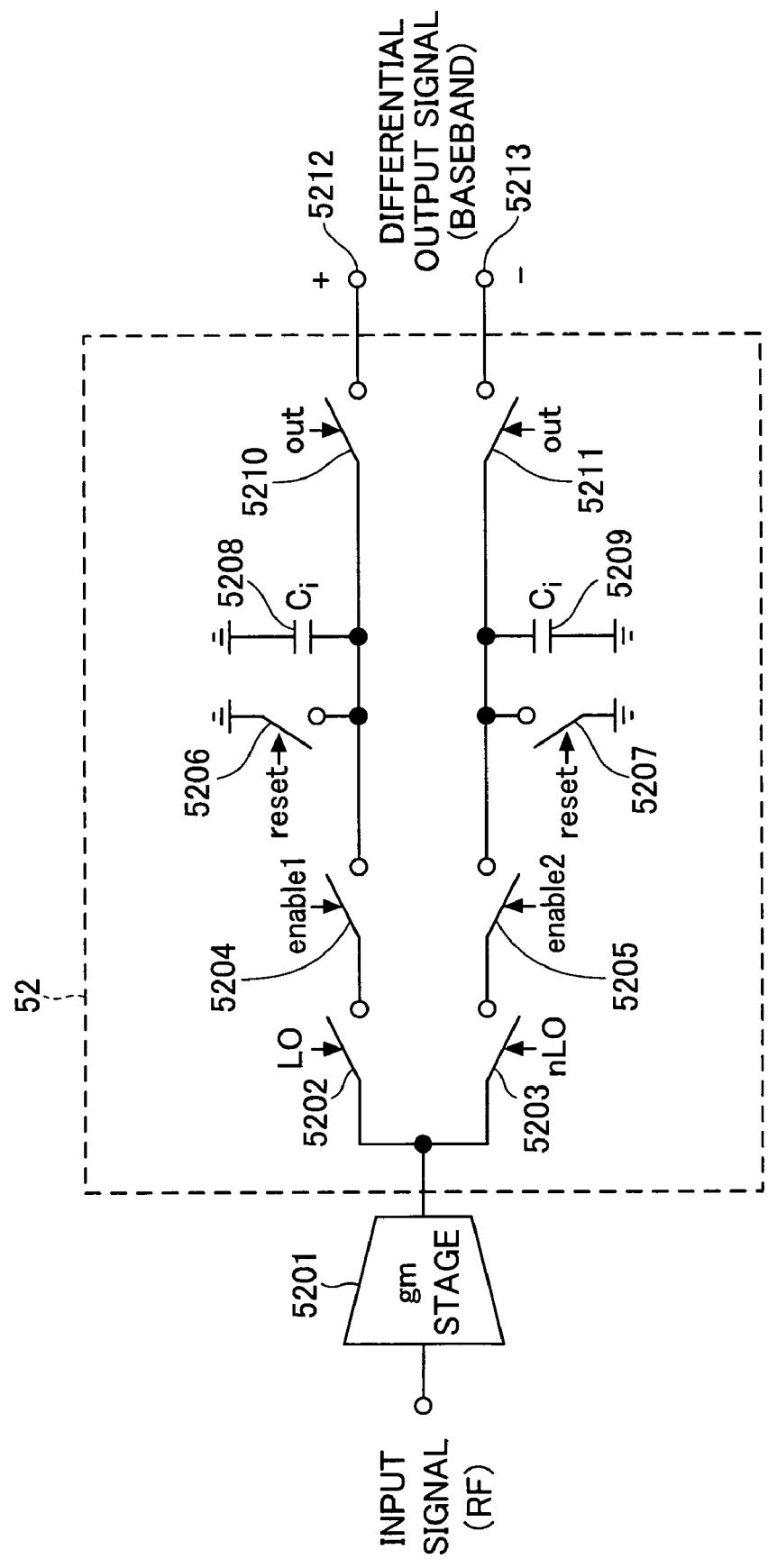
FIG. 16 is a circuit block diagram illustrating the arrangement of a charge subsampling circuit in a mixer in accordance with a fourth embodiment of the present invention.
Figure 17:
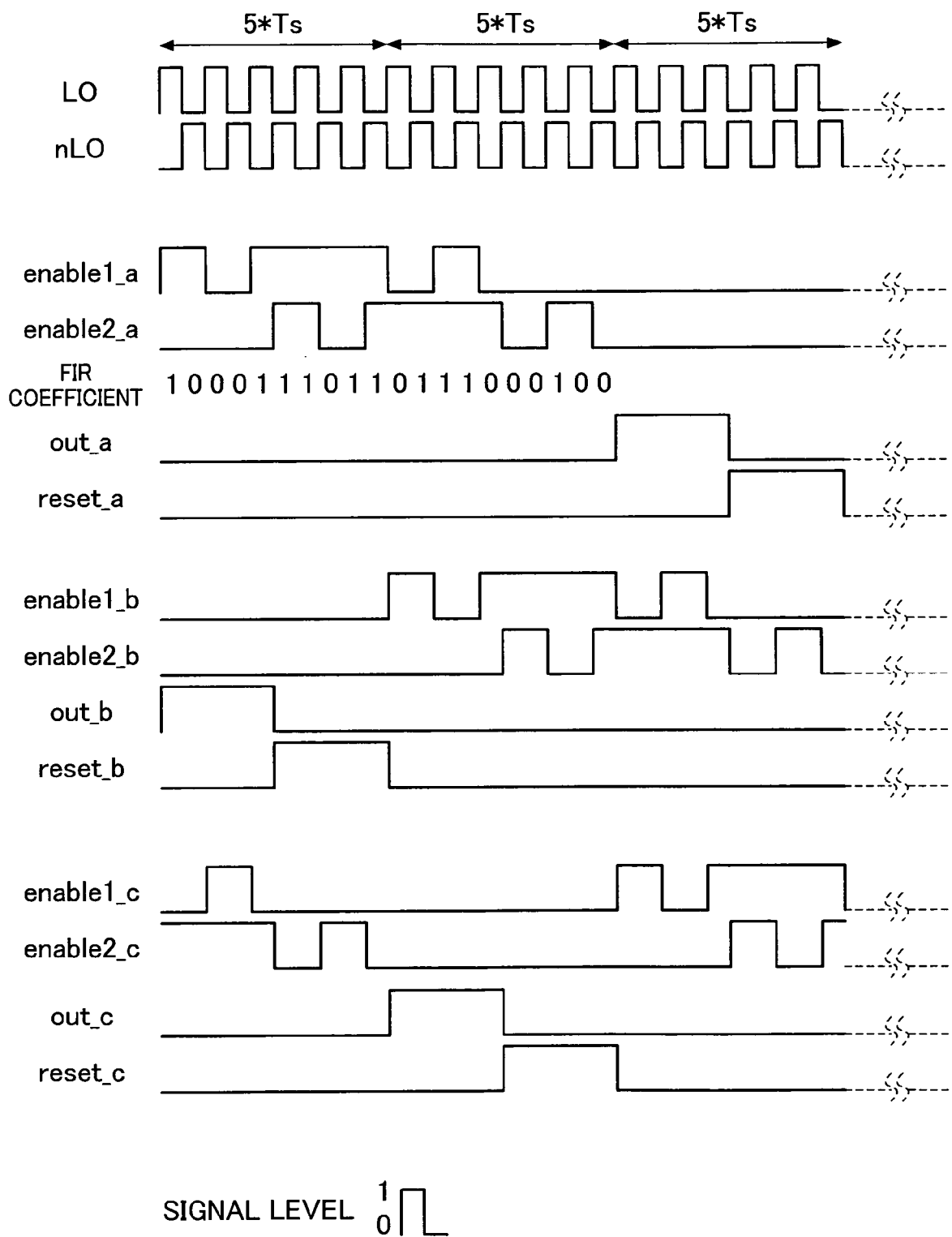
FIG. 17 is a timing chart illustrating timings of signals for the mixer in FIG. 16.

The following will describe another embodiment of the present invention in reference to FIG. 16 and FIG. 17. Here, for convenience, members of the present embodiment that have the same arrangement and function as members of embodiment 1, 2, 3, or 4, and that are mentioned in that embodiment are indicated by the same reference numerals and description thereof is omitted.

FIG. 16 shows a part of the arrangement of a charge subsampling mixer in accordance with the present embodiment. The charge subsampling mixer includes three parallel pairs of a gm stage 5201 and a charge subsampling circuit 52 as in the arrangement shown in FIG. 5 for embodiment 1. The three gm stage 5201 form a current generating circuit (current source). Also, the mixer includes a similar timing generating block to the timing generating block 11 in FIGS. 2(a) and 2(b) as a timing generating block (control circuit).

The gm stage 5201 generates current in proportion to the voltage of the input signal (RF). The charge subsampling circuit 52 has a positive-side path and a negative-side path.

The positive-side path is equipped, sequentially from the input side to the output side, with an input switch (D first switch) 5202, an integration control switch (D second switch) 5204, a reset switch (D third switch) 5206, an integrating capacitor (first capacitor) 5208, and an output switch (D fourth switch) 5210. The input switch 5202, the integration control switch 5204, and the output switch 5210 are connected in series on the positive-side path. The reset switch 5206 and the integrating capacitor 5208 are connected at one end to respective points between the integration control switch 5204 and the output switch 5210. The other ends are grounded (GND, first reference voltage). The positions of the reset switch 5206 and the integrating capacitor 5208 may be interchanged.

The negative-side path is equipped, sequentially from the input side to the output side, with an input switch (D fifth switch) 5203, an integration control switch (D sixth switch) 5205, a reset switch (D seventh switch) 5207, an integrating capacitor (second capacitor) 5209, and an output switch (D eighth switch) 5211. The input switch 5203, the integration control switch 5205, and the output switch 5211 are connected in series on the negative-side path. The reset switch 5207 and the integrating capacitor 5209 are connected at one end to respective points between the integration control switch 5205 and the output switch 5211. The other ends are grounded (GND, second reference voltage). The positions of the reset switch 5207 and the integrating capacitor 5209 may be interchanged.

The integrating capacitors 5208, 5209 have a capacitance of Ci.

As the output switch 5210 is turned on, the integrating capacitor 5208 is connected to the plus output terminal 5212. Likewise, as the output switch 5211 is turned on, the integrating capacitor 5209 is connected to the minus output terminal 5213. The voltage difference between the plus output terminal 5212 and the minus output terminal 5213 is the output signal (differential signal).

The charge subsampling circuit 52 has the same arrangement as the charge subsampling circuit 12 in FIGS. 2(a) and 2(b), except that separated control signals are used to control the integration control switch 5204 and the integration control switch 5205. Details follow.

FIG. 17 shows an exemplary timing diagram for the control signals of the present embodiment.

Throughout the rest of the present embodiment, the signal LO is the first rectangular signal, the signal nLO is the second rectangular signal, the signal enable1 is the D first digital signal, the signal enable2 is the D second digital signal, the signal out is the D third digital signal, and the signal reset is the D fourth digital signal.

The present embodiment differs from embodiment 1 in that there are two signals enable1 and enable2 for each charge subsampling circuit. A minimum time period for the signals enable is Ts. The odd-numbered coefficients ($a_1, a_3 \ldots$) of the FIR filter is determined from the value of the signal enable1 when the signal LO is 1. The even-numbered coefficients ($a_0, a_2 \ldots$) of the FIR filter are determined from the value of the signal enable2 when the signal nLO is 1.

The present embodiment realizes the same FIR filter as embodiment 1. In addition, by setting a minimum period for the signals enable1 and enable2 to 2×Ts/2, or as long as twice that in embodiments 1 through 4, the ratio of the minimum period for the signal to the rising period of the signal is increased. This diminishes errors in charging of the integrating capacitor, which in turn makes it easier to realize the charge subsampling circuit.

In addition, it is also possible to use only one gm stage as in embodiment 2.

Embodiment 6

Figure 18:
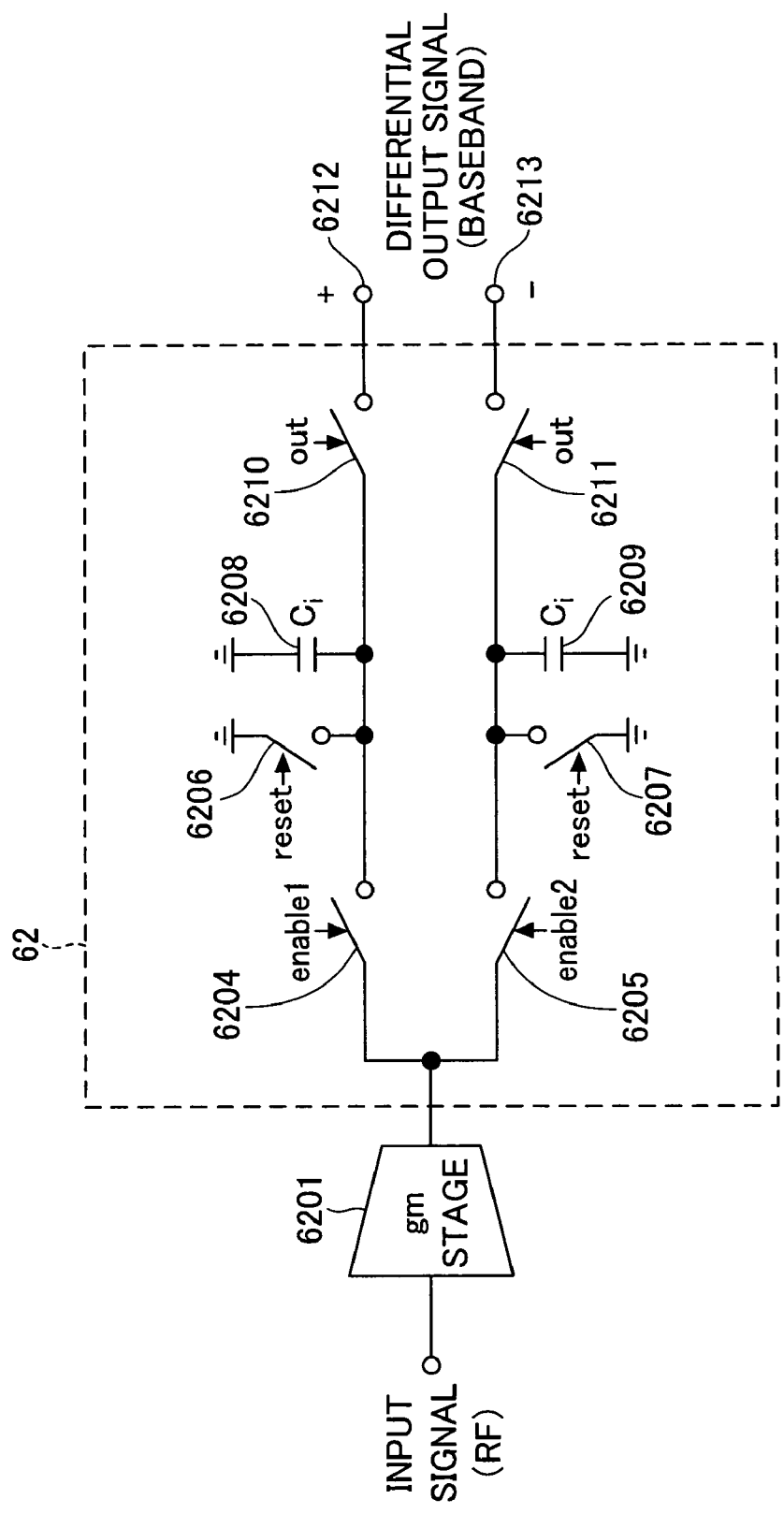
FIG. 18 is a circuit block diagram illustrating the arrangement of a charge subsampling circuit in a mixer in accordance with a fifth embodiment of the present invention.
Figure 19:
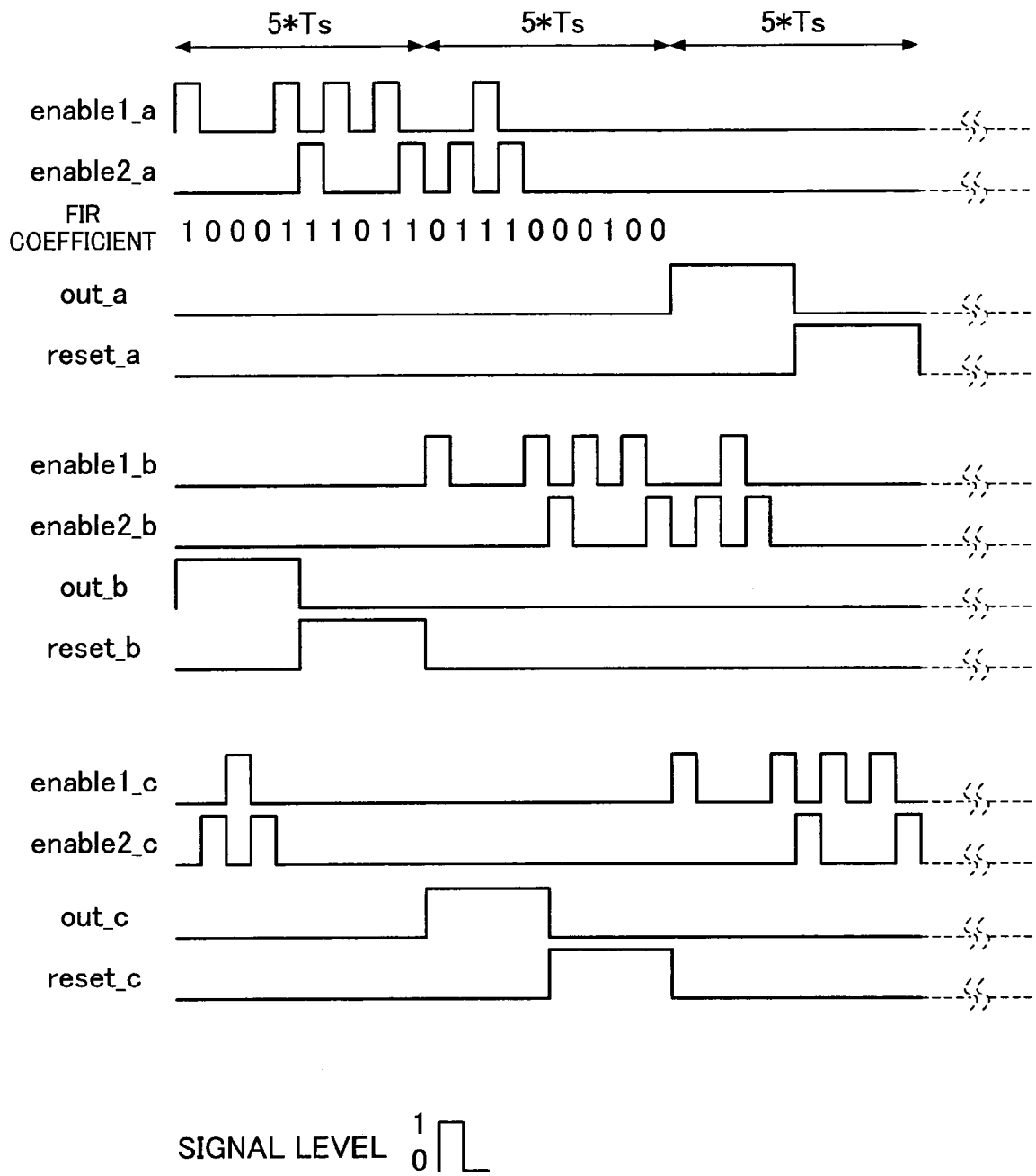
FIG. 19 is a timing chart illustrating timings of signals for the mixer in FIG. 18.

The following will describe another embodiment of the present invention in reference to FIG. 18 and FIG. 19. Here, for convenience, members of the present embodiment that have the same arrangement and function as members of embodiment 1, 2, 3, 4, or 5, and that are mentioned in that embodiment are indicated by the same reference numerals and description thereof is omitted.

FIG. 18 shows a part of the arrangement of a charge subsampling mixer in accordance with the present embodiment. The charge subsampling mixer includes three parallel pairs of a gm stage 6201 and a charge subsampling circuit 62 as in the arrangement shown in FIG. 5 for embodiment 1. The three gm stage 6201 form a current generating circuit (current source). Also, the mixer includes a similar timing generating block to the timing generating block 11 in FIGS. 2(a) and 2(b) as a timing generating block (control circuit).

The gm stage 6201 generates current in proportion to the voltage of the input signal (RF). The charge subsampling circuit 62 has a positive-side path and a negative-side path.

The positive-side path is equipped, sequentially from the input side to the output side, with an integration control switch (E first switch) 6204, a reset switch (E second switch) 6206, an integrating capacitor (first capacitor) 6208, and an output switch (E third switch) 6210. The integration control switch 6204 and the output switch 6210 are connected in series on the positive-side path. The reset switch 6206 and the integrating capacitor 6208 are connected at one end to respective points between the integration control switch 6204 and the output switch 6210. The other ends are grounded (GND, first reference voltage). The positions of the reset switch 6206 and the integrating capacitor 6208 may be interchanged.

The negative-side path is equipped, sequentially from the input side to the output side. with an integration control switch (E fourth switch) 6205, a reset switch (E fifth switch) 6207, an integrating capacitor (second capacitor) 6209, and an output switch (E sixth switch) 6211. The integration control switch 6205 and the output switch 6211 are connected in series on the negative-side path. The reset switch 6207 and the integrating capacitor 6209 are connected at one end to respective points between the integration control switch 6205 and the output switch 6211. The other ends are grounded (GND, second reference voltage). The positions of the reset switch 6207 and the integrating capacitor 6209 may be interchanged.

The integrating capacitors 6208, 6209 have a capacitance of Ci.

As the output switch 6210 is turned on, the integrating capacitor 6208 is connected to the plus output terminal 6212. Likewise, as the output switch 6211 is turned on, the integrating capacitor 6209 is connected to the minus output terminal 6213. The voltage difference between the plus output terminal 6212 and the minus output terminal 6213 is the output signal (differential signal).

FIG. 19 shows an exemplary timing diagram for the control signals of the present embodiment.

Throughout the rest of the present embodiment, the signal enable1 is the E first digital signal, the signal enable2 is the E second digital signal, the signal out is the E third digital signal, and the signal reset is the E fourth digital signal.

The present embodiment differs from embodiment 1 in that there are no signals LO, nLO (in other words, the timing generating block does not generate the first group of signals) and that there are two signals enable1 and enable2 for each charge subsampling circuit.

if embodiment 1 and the present embodiment provide the same FIR filters, the relationships hold:

enable1=LO AND enable
enable2=nLO AND enable

In these equations, the left sides are signals of the present embodiment, and the right sides are those of embodiment 1. That is, in the present embodiment, the input switch 1202 and the integration control switch 1204 in embodiment 1 are combined, and the input switch 1203 and the integration control switch 1205 are combined. Combining the switches leaves only the integration control switches 6204, 6205 that connect the charge subsampling circuit 62 to the output of the gm stage 6201. This reduces the number of switches, hence, the parasitic capacitance and resistance of the switches and the circuit area.

Embodiment 7

Figure 20:
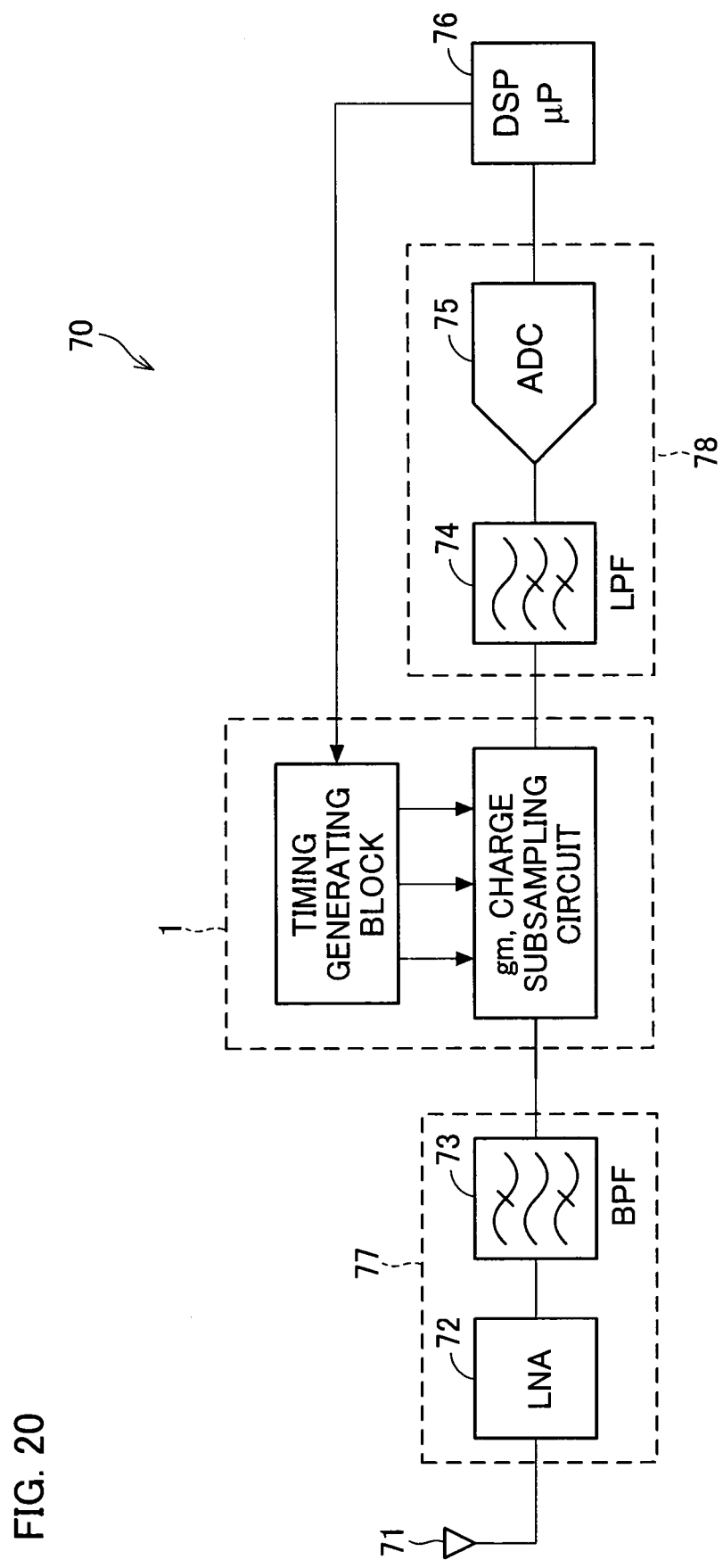
FIG. 20 is a block diagram illustrating the arrangement of a tuner including the mixer of the first to the fifth embodiment.
Figure 21:
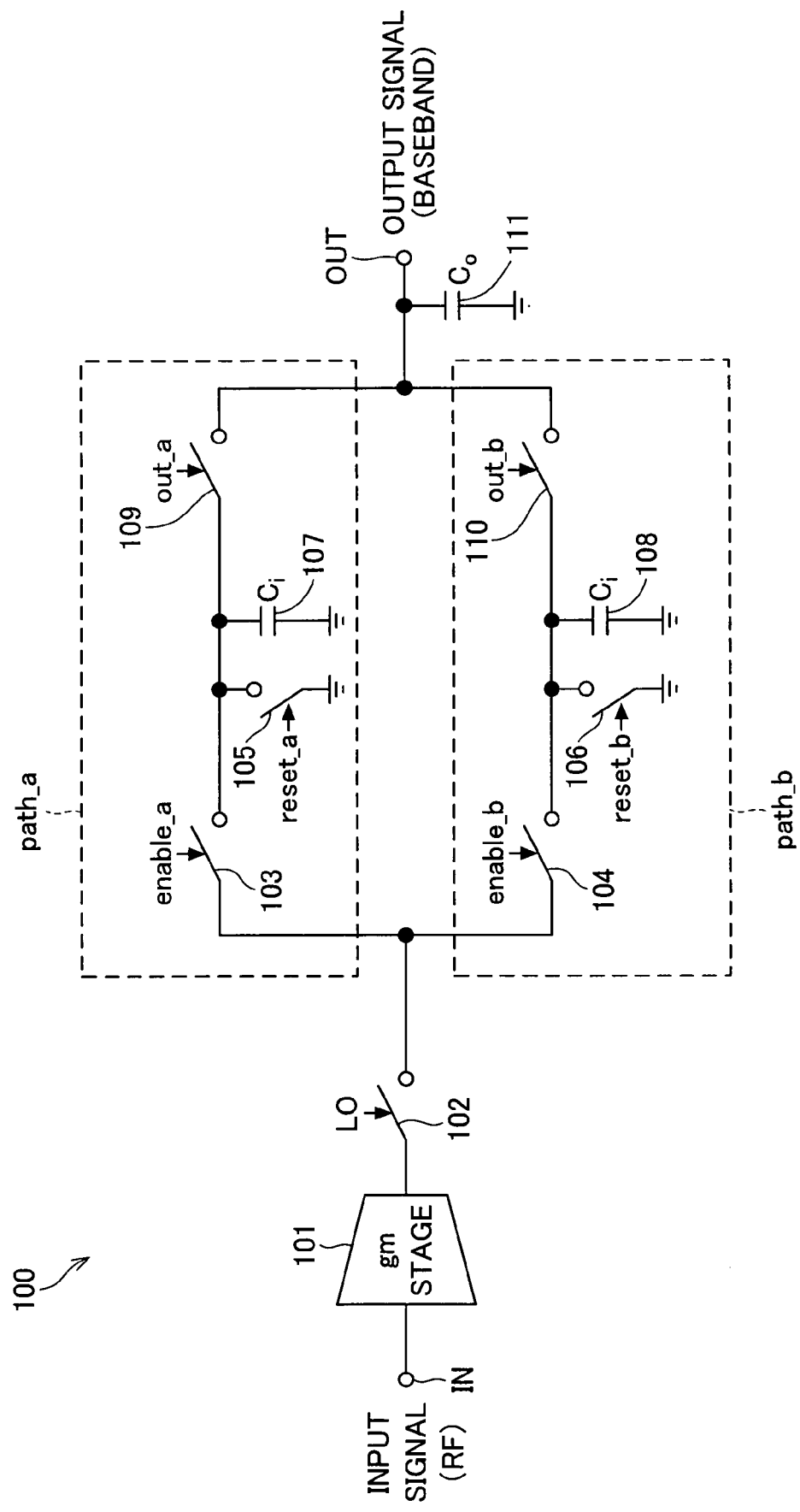
FIG. 21 is a circuit block diagram, relating to conventional art, illustrating the arrangement of a mixer.
Figure 22:
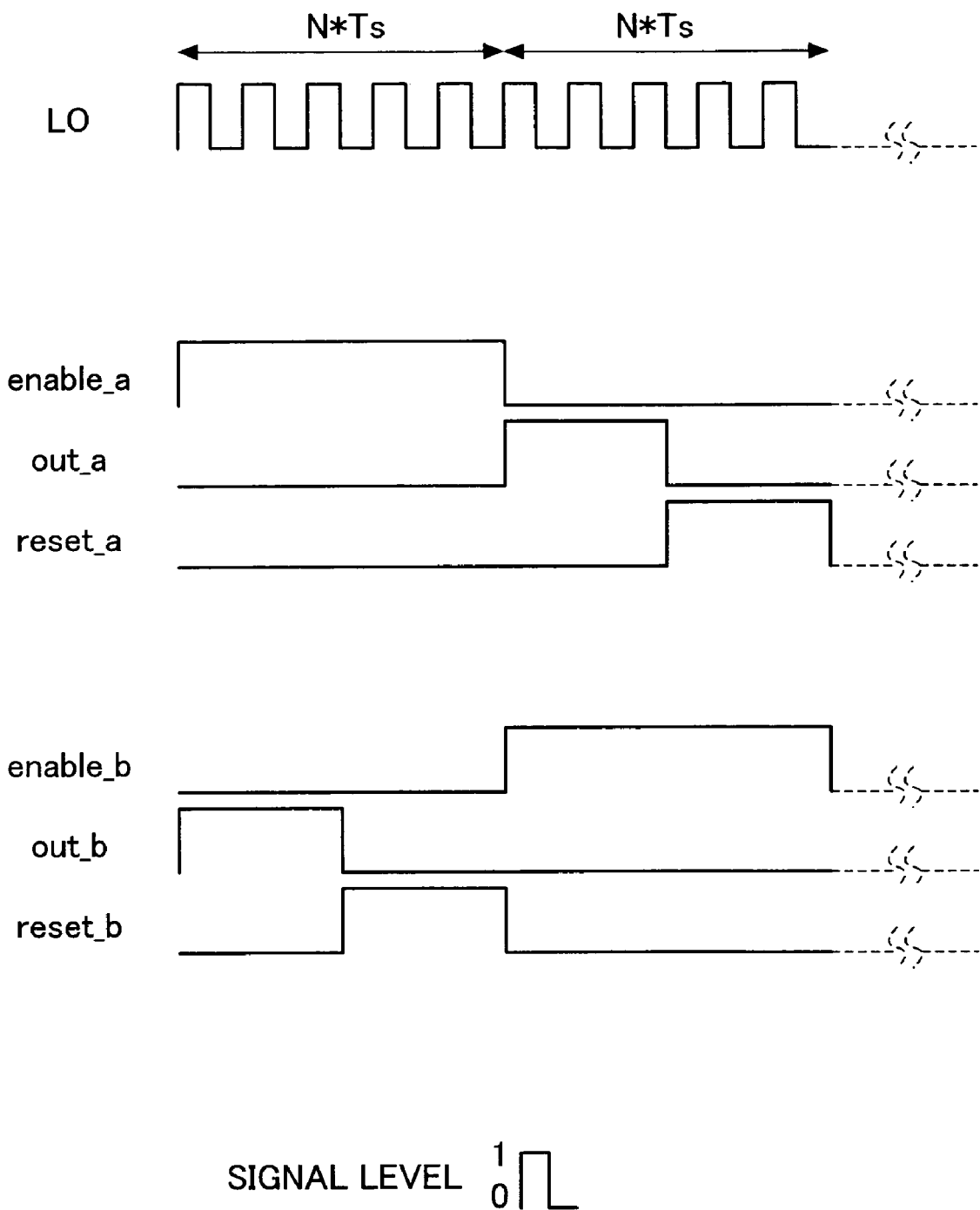
FIG. 22 is a timing chart illustrating timings of signals for the mixer in FIG. 21.
Figure 23:
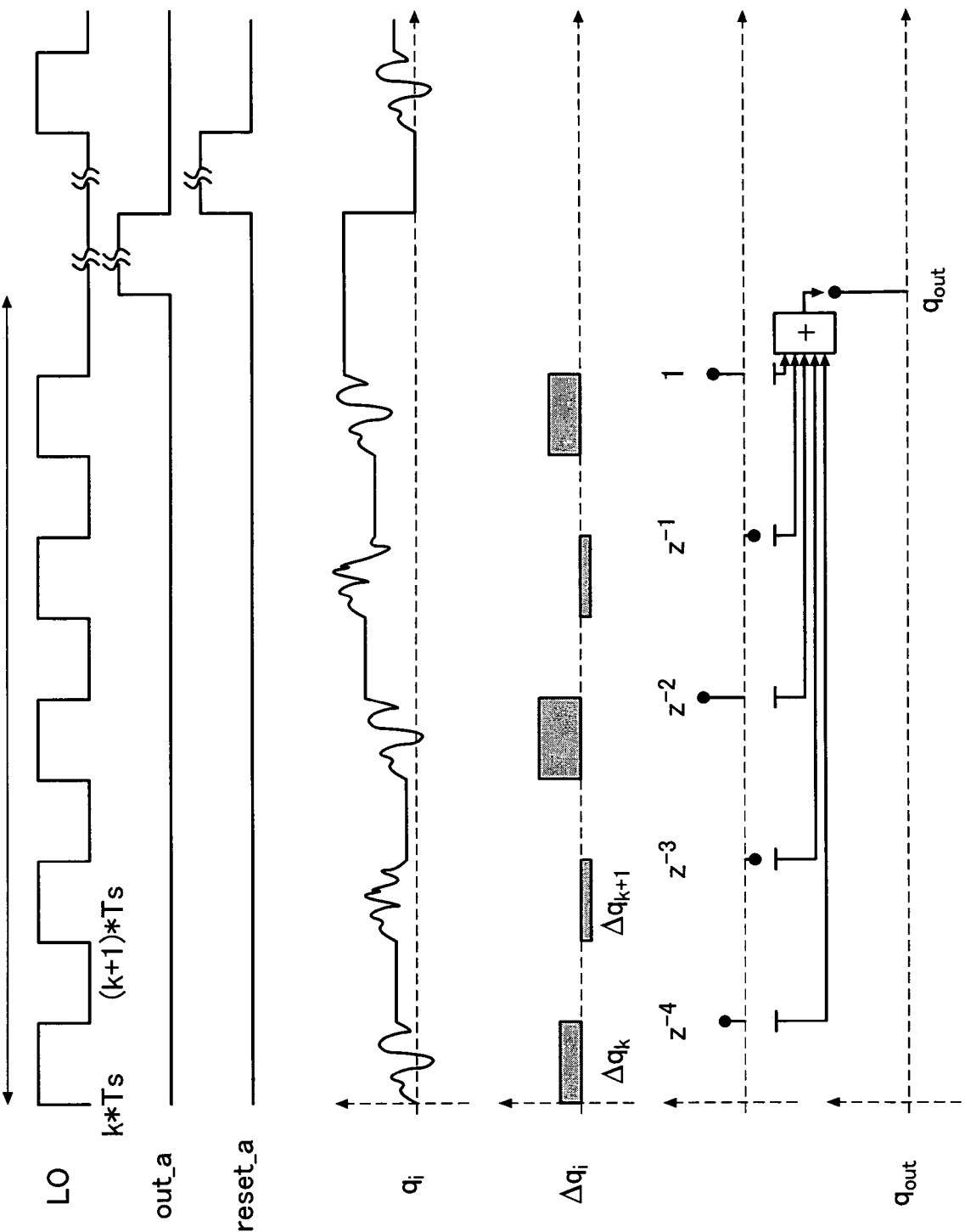
FIG. 23 is a timing chart illustrating how the mixer in FIG. 21 is charged.
Figure 24:
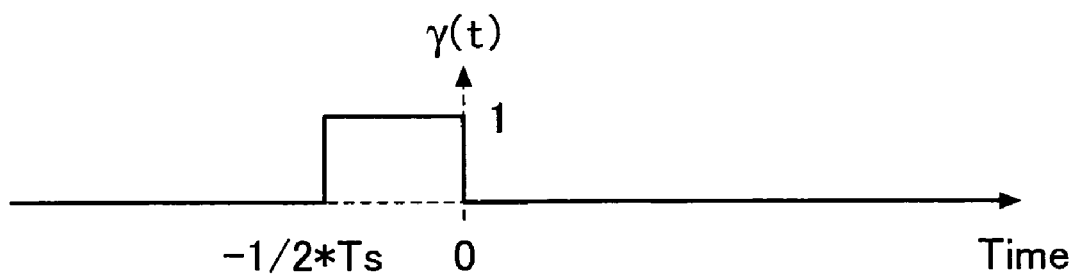
FIG. 24 is a waveform diagram showing the basic waveform of the signal LO in FIG. 22.
Figure 25:
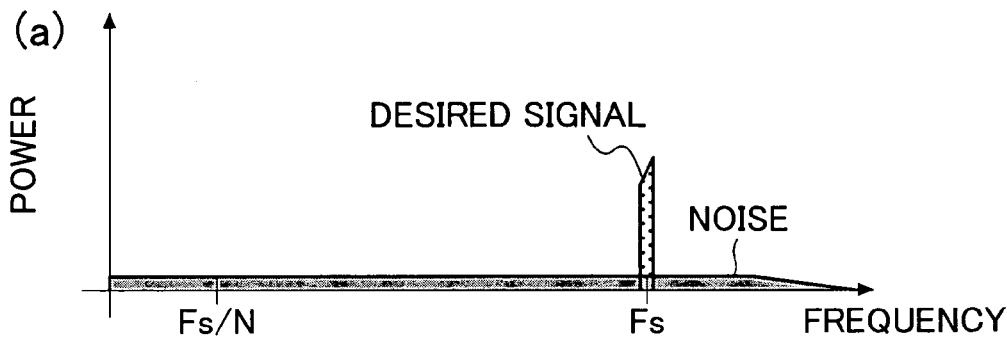
FIG. 25(a) through FIG. 25(e) are spectrum drawings and a gain characteristic drawing for an FIR filter, illustrating the mixer in FIG. 21 attenuating noise.
Figure 25:
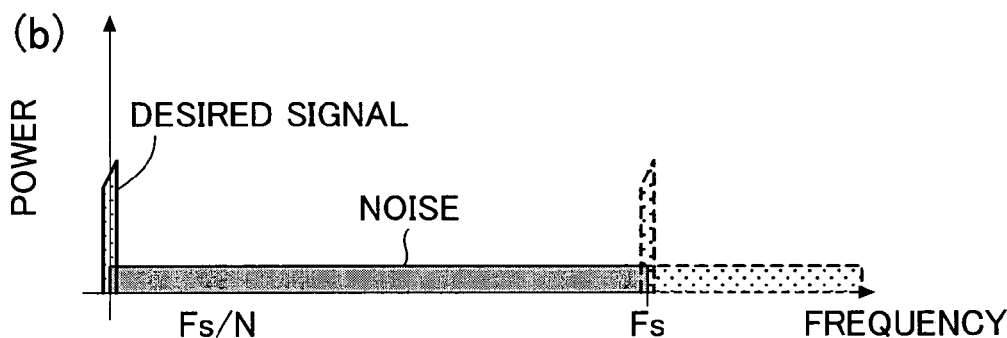
Figure 25:
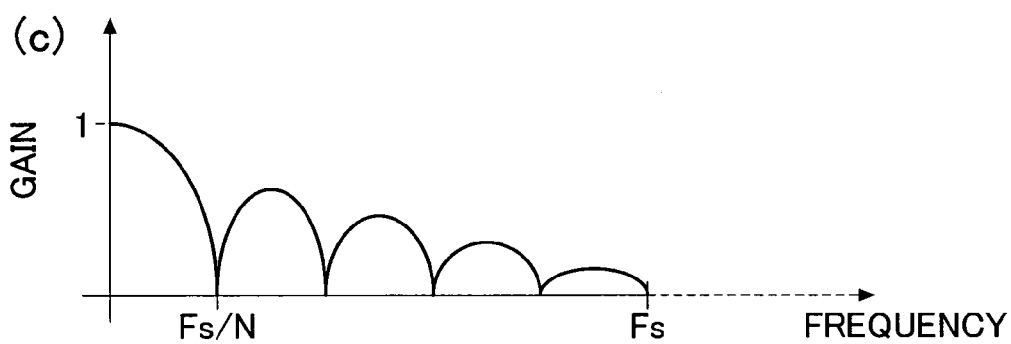
Figure 25:
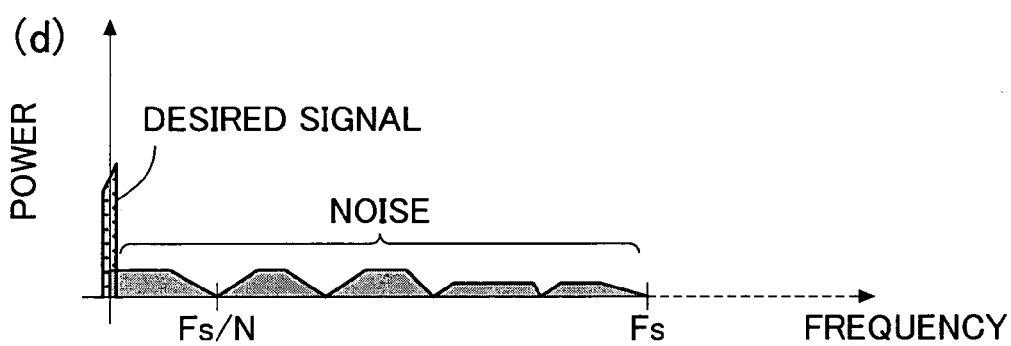
Figure 25:
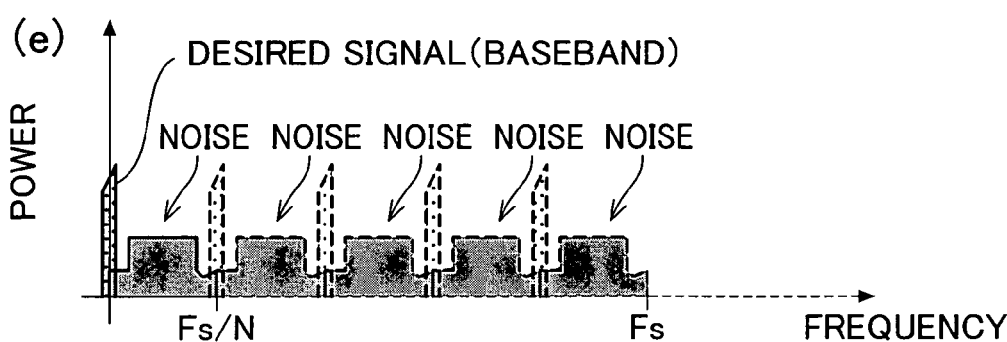

The following will describe another embodiment of the present invention in reference to FIG. 20.

FIG. 20 is a block diagram of an exemplary arrangement of a television tuner incorporating any one of the charge subsampling mixers described in embodiments 1 through 6. A tuner 70 in FIG. 20 includes: an antenna 71; an LNA (low noise amplifier) 72, provided in the RF front end 77, which amplifies a signal received by the antenna 71; an RF bandpass filter 73, provided in the RF front end 77, which attenuates undesired signals; a charge subsampling mixer of the present invention (for example, the charge subsampling mixer 1); a lowpass filter 74 provided in an analog base band signal processing section 78; an ADC 75, provided in the analog base band signal processing section 78, which converts an analog signal to an digital signal; a DSP (digital signal processor) or micro processor 76 which processes the digital signal. The frequency, timing pattern, etc. for the charge subsampling mixer 1 are controllable in response to the received signal by feeding the output of the DSP or micro processor 76 back to the charge subsampling mixer 1.

The present invention is suitable for use in apparatus which receives wide bandwidth signals, such as a television tuner.

What is claimed is:

1. A mixer for producing a base band signal by demodulating an input signal which is a carrier modulated with the base band signal, the mixer comprising:
   a current source for generating a current in proportion to a voltage of the input signal;
   a charge subsampling circuit to which the current generated by the current source is supplied; and
   a control circuit for generating a signal controlling sampling of the current by the charge subsampling circuit,
   wherein the charge subsampling circuit, under control of the sampling by the control circuit, generates a discrete time signal in a bandwidth 1/N times a frequency of the carrier from the input signal (N is an integer greater than 1), and the mixer performing filtering by means of an FIR filter realized by a charge integrating process of forming current which accompanies the generation of the discrete time signal,
   wherein the charge subsampling circuit carries out: the sampling at the same sampling frequency as the frequency of the carrier; and in the integrating process, weighting of terms in a transfer function of the FIR filter with weights selected from a set of weights.

2. The mixer of claim 1, wherein:
   the current source has as many current outputs as charge subsampling circuits for each input signal; and
   the outputs are coupled to inputs of different charge subsampling circuits.

3. The mixer of claim 2, wherein the current source generates the current by means of a transconductance stage provided for each of the outputs.

4. The mixer of claim 2, wherein the current source generates the current by means of one transconductance stage provided commonly for the outputs.

5. The mixer of claim 1, wherein:
the charge subsampling circuit has a positive-side path and a negative-side path, forming a differential output, which are coupled to an output of the current source;
the positive-side path has an A first switch, an A second switch, an A fourth switch, an A third switch, and a first capacitor, the A first switch, the A second switch, and the A fourth switch being connected sequentially in series from an input side to an output side, the A third switch and the first capacitor being connected between respective points between the A second switch and the A fourth switch and a place of a first reference voltage; and
the negative-side path has an A fifth switch, an A sixth switch, an A eighth switch, an A seventh switch, and a second capacitor, the A fifth switch, the A sixth switch, and the A eighth switch being connected sequentially in series from an input side to an output side, the A seventh switch and the second capacitor being connected between respective points between the A sixth switch and the A eighth switch and a place of a second reference voltage;
wherein:
letting Fs represent the sampling frequency which is equal to the frequency of the carrier and the mixer comprise m charge subsampling circuits,
the A first switch is turned on/off under control of a first rectangular signal having a frequency of Fs;
the A fifth switch is turned on/off under control of a second rectangular signal 180 degrees out of phase with the first rectangular signal;
the A second switch and the A sixth switch are turned on/off under control of an A first digital signal having a period of N×m/Fs;
the A fourth switch and the A eighth switch are turned on/off under control of an A second digital signal having a period of N×m/Fs;
the A third switch and the A seventh switch are turned on/off under control of an A third digital signal having a period of N×m/Fs;
there are provided time periods T1, T2, and T3 in this sequence in one period of the A first to A third digital signals, the time periods T1, T2, and T3 when summed being equal to the period;
in the time period T1, the A first digital signal is a series of 1s and 0s, whereas the A second digital signal and the A third digital signal are 0;
in the time period T2, the A second digital signal is 1, whereas the A first digital signal and the A third digital signal are 0; and
in the time period T3, the A third digital signal is 1, whereas the A first digital signal and the A fourth digital signal are 0.

6. The mixer of claim 5, wherein $T1=N\times(m-1)/Fs$, $T2=0.5\times N/Fs$, and $T3=0.5\times N/Fs$.

7. The mixer of claim 5, wherein the first capacitor and the second capacitor have equal capacitances.

8. The mixer of claim 1, wherein:
the charge subsampling circuit has a positive-side path and a negative-side path, the positive-side path forming a differential output and including a B first switch and being coupled to an output of the current source via the B first switch, the negative-side path including a B second switch and being coupled to an output of the current source via the B second switch;
the positive-side path includes a first positive-side path and a second positive-side path provided in parallel between the B first switch and a plus output terminal of the differential output;
the negative-side path includes a first negative-side path and a second negative-side path provided in parallel between the B second switch and a minus output terminal of the differential output;
the first positive-side path has a B third switch, a B fifth switch, a B fourth switch, and a first capacitor, the B third switch and the B fifth switch being connected sequentially in series from an input side to an output side, the B fourth switch and the first capacitor being connected between respective points between the B third switch and the B fifth switch and a place of a first reference voltage;
the second positive-side path has a B sixth switch, a B eighth switch, a B seventh switch, and a second capacitor, the B sixth switch and the B eighth switch being connected sequentially in series from an input side to an output side, the B seventh switch and the second capacitor being connected between respective points between the B sixth switch and the B eighth switch and a place of a second reference voltage;
the first negative-side path has a B ninth switch, a B eleventh switch, a B tenth switch, and a third capacitor, the B ninth switch and the B eleventh switch being connected sequentially in series from an input side to an output side, the B tenth switch and the third capacitor being connected between respective points between the B ninth switch and the B eleventh switch and a place of a third reference voltage; and
the second negative-side path has a B twelfth switch, a B fourteenth switch, a B thirteenth switch, and a fourth capacitor, the B twelfth switch and the B fourteenth switch being connected sequentially in series from an input side to an output side, the B thirteenth switch and the fourth capacitor being connected between respective points between the B twelfth switch and the B fourteenth switch and a place of a fourth reference voltage,
wherein:
letting Fs represent the sampling frequency which is equal to the frequency of the carrier and the mixer comprise m charge subsampling circuits,
the B first switch is turned on/off under control of a first rectangular signal having a frequency of Fs;
the B second switch is turned on/off under control of a second rectangular signal 180 degrees out of phase with the first rectangular signal;
the B third switch and the B ninth switch are turned on/off under control of a B first digital signal having a period of N×m/Fs;
the B sixth switch and the B twelfth switch are turned on/off under control of a B second digital signal having a period of N×m/Fs;
the B fifth switch, the B eighth switch, the B eleventh switch, and the B fourteenth switch are turned on/off under control of a B third digital signal having a period of N×m/Fs;

the B fourth switch, the B seventh switch, the B tenth switch, and the B thirteenth switch are turned on/off under control of a B fourth digital signal having a period of N×m/Fs;

there are provided time periods T1, T2, and T3 in this sequence in one period of the B first to B fourth digital signals, the time periods T1, T2, and T3 when summed being equal to the period;

in the time period T1, the B first digital signal and the B second digital signal are a series of 1s and 0s and are not simultaneously 1, whereas the B third digital signal and the B fourth digital signal are 0;

in the time period T2, the B third digital signal is 1, whereas the B first digital signal, the B second digital signal, and the B fourth digital signal are 0; and in the time period T3, the B fourth digital signal is 1, whereas the B first digital signal, the B second digital signal, and the B third digital signal are 0.

9. The mixer of claim 8, wherein:

the first capacitor and the third capacitor have equal capacitances;

the second capacitor and the fourth capacitor have equal capacitances; and the capacitances of the first capacitor and the third capacitor are different from those of the second capacitor and the fourth capacitor.

10. The mixer of claim 1, wherein:

the charge subsampling circuit has a C first switch, a C second switch, a first positive-side path, a second negative-side path, a first negative-side path, and a second positive-side path, the first positive-side path and the second negative-side path being coupled to an output of the current source via the C first switch, the first negative-side path and the second positive-side path being coupled to an output of the current source via the C second switch;

the first positive-side path includes a C third switch, a C fifth switch, a C fourth switch, and a first capacitor, the C third switch and the C fifth switch being connected sequentially in series from an input side to an output side between the C first switch and a plus output terminal of a differential output, the C fourth switch and the first capacitor being connected between respective points between the C third switch and the C fifth switch and a place of a first reference voltage;

the first negative-side path includes a C sixth switch, a C eighth switch, a C seventh switch, and a second capacitor, the C sixth switch and the C eighth switch being connected sequentially in series from an input side to an output side between the C second switch and a minus output terminal of the differential output, the C seventh switch and the second capacitor being connected between respective points between the C sixth switch and the C eighth switch and a place of a second reference voltage;

the second positive-side path includes a C tenth switch, the C fifth switch, the C fourth switch, and the first capacitor, the C tenth switch and the C fifth switch being connected sequentially in series from an input side to an output side between the C second switch and the plus output terminal; and the second negative-side path includes a C ninth switch, the C eighth switch, the C seventh switch, and the second capacitor, the C ninth switch and the C eighth switch being connected sequentially in series from an input side to an output side between the C first switch and the minus output terminal;

wherein:

letting Fs represent the sampling frequency which is equal to the frequency of the carrier and the mixer comprise m charge subsampling circuits, the C first switch is turned on/off under control of a first rectangular signal having a frequency of Fs;

the C second switch is turned on/off under control of a second rectangular signal 180 degrees out of phase with the first rectangular signal;

the C third switch and the C sixth switch are turned on/off under control of a C first digital signal having a period of N×m/Fs;

the C ninth switch and the C tenth switch are turned on/off under control of a C second digital signal having a period of N×m/Fs;

the C fifth switch and the C eighth switch are turned on/off under control of a C third digital signal having a period of N×m/Fs;

the C fourth switch and the C seventh switch are turned on/off under control of a C fourth digital signal having a period of N×m/Fs;

there are provided time periods T1, T2, and T3 in this sequence in one period of the C first to C fourth digital signals, the time periods T1, T2, and T3 when summed being equal to the period;

in the time period T1, the C first digital signal and the C second digital signal are a series of 1s and 0s and are not simultaneously 1, whereas the C third digital signal and the C fourth digital signal are 0;

in the time period T2, the C third digital signal is 1, whereas the C first digital signal, the C second digital signal, and the C fourth digital signal are 0; and in the time period T3, the C fourth digital signal is 1, whereas the C first digital signal, the C second digital signal, and the C third digital signal are 0.

11. The mixer of claim 1, wherein:

the charge subsampling circuit has a positive-side path and a negative-side path, forming a differential output, which are coupled to an output of the current source;

the positive-side path has a D first switch, a D second switch, a D fourth switch, a D third switch, and a first capacitor, the D first switch, the D second switch, and the D fourth switch being connected sequentially in series from an input side to an output side, the D third switch and the first capacitor being connected between respective points between the D second switch and the D fourth switch and a place of a first reference voltage; and the negative-side path has a D fifth switch, a D sixth switch, a D eighth switch, a D seventh switch, and a second capacitor, the D fifth switch, the D sixth switch, and the D eighth switch being connected sequentially in series from an input side to an output side, the D seventh switch and the second capacitor being connected between respective points between the D sixth switch and the D eighth switch and a place of a second reference voltage, wherein:

letting Fs represent the sampling frequency which is equal to the frequency of the carrier and the mixer comprise m charge subsampling circuits;

the D first switch is turned on/off under control of a first rectangular signal having a frequency of Fs;

the D fifth switch is turned on/off under control of a second rectangular signal 180 degrees out of phase with the first rectangular signal;

the D second switch is turned on/off under control of a D first digital signal having a period of N×m/Fs;

the D sixth switch is turned on/off under control of a D second digital signal having a period of N×m/Fs;

the D fourth switch and the D eighth switch are turned on/off under control of a D third digital signal having a period of N×m/Fs;

the D third switch and the D seventh switch are turned on/off under control of a D fourth digital signal having a period of N×m/Fs;

there are provided time periods T1, T2, and T3 in this sequence in one period of the D first to D fourth digital signals, the time periods T1, T2, and T3 when summed being equal to the period;

in the time period T1, the D first digital signal and the D second digital signal are a series of 1s and 0s, whereas the D third digital signal and the D fourth digital signal are 0;

in the time period T2, the D third digital signal is 1, whereas the D first digital signal, the D second digital signal, and the D fourth digital signal are 0; and in the time period T3, the D fourth digital signal is 1, whereas the D first digital signal, the D second digital signal, and the D third digital signal are 0.

12. The mixer of claim 1, wherein:

the charge subsampling circuit has a positive-side path and a negative-side path, forming a differential output, which are coupled to an output of the current source;

the positive-side path has an E first switch, an E third switch, an E second switch, and a first capacitor, the E first switch and the E third switch being connected sequentially in series from an input side to an output side, the E second switch and the first capacitor being connected between respective points between the E first switch and the E third switch and a place of a first reference voltage; and the negative-side path has an E fourth switch, an E sixth switch, an E fifth switch, and a second capacitor, the E fourth switch and the E sixth switch being connected sequentially in series from an input side to an output side, the E fifth switch and the second capacitor being connected between respective points between the E fourth switch and the E sixth switch and a place of a second reference voltage, wherein:

letting Fs represent the sampling frequency which is equal to the frequency of the carrier and the mixer comprise m charge subsampling circuits;

the E first switch is turned on/off under control of an E first digital signal having a period of N×m/Fs;

the E fourth switch is turned on/off under control of an E second digital signal having a period of N×m/Fs;

the E third switch and the E sixth switch are turned on/off under control of an E third digital signal having a period of N×m/Fs;

the E second switch and the E fifth switch are turned on/off under control of an E fourth digital signal having a period of N×m/Fs;

there are provided time periods T1, T2, and T3 in this sequence in one period of the E first to E fourth digital signals, the time periods T1, T2, and T3 when summed being equal to the period;

in the time period T1, the E first digital signal and the E second digital signal are a series of 1s and 0s and are not simultaneously 1, whereas the E third digital signal and the E fourth digital signal are 0;

in the time period T2, the E third digital signal is 1, whereas the E first digital signal, the E second digital signal, and the E fourth digital signal are 0; and in the time period T3, the E fourth digital signal is 1, whereas the E first digital signal, the E second digital signal, and the E third digital signal are 0.

* * * * *